(12) United States Patent
Gupta

(10) Patent No.: US 11,088,653 B1
(45) Date of Patent: Aug. 10, 2021

(54) SOLAR ENERGY COLLECTOR HAVING A TREE STRUCTURE

(71) Applicant: Vivek Gupta, Kingston (CA)

(72) Inventor: Vivek Gupta, Kingston (CA)

(*) Notice: Subject to any disclaimer, the term of this patent is extended or adjusted under 35 U.S.C. 154(b) by 0 days.

(21) Appl. No.: 17/268,735

(22) PCT Filed: Aug. 16, 2019

(86) PCT No.: PCT/CA2019/000118
§ 371 (c)(1),
(2) Date: Feb. 16, 2021

(87) PCT Pub. No.: WO2020/034025
PCT Pub. Date: Feb. 20, 2020

Related U.S. Application Data

(60) Provisional application No. 62/719,408, filed on Aug. 17, 2018.

(51) Int. Cl.
*H02S 10/12* (2014.01)
*H01L 31/042* (2014.01)
(Continued)

(52) U.S. Cl.
CPC ............ *H02S 10/12* (2014.12); *H01L 31/042* (2013.01); *H02S 30/10* (2014.12); *H02S 40/22* (2014.12); *H02S 40/38* (2014.12); *H02S 40/425* (2014.12)

(58) Field of Classification Search
CPC ......... Y02E 10/40; Y02E 10/44; Y02E 10/46; Y02E 10/50; Y02E 10/52; Y02E 10/60;
(Continued)

(56) References Cited

U.S. PATENT DOCUMENTS

| 4,122,675 A | 10/1978 | Polyak |
| 4,433,544 A | 2/1984 | Wells et al. |

(Continued)

FOREIGN PATENT DOCUMENTS

| CN | 106452292 A | 2/2017 |
| WO | 2015198348 A1 | 12/2015 |

OTHER PUBLICATIONS

International Search Report dated Oct. 18, 2019, for International Application No. PCT/CA2019/000118 filed Aug. 16, 2019.
(Continued)

*Primary Examiner* — Christina Chern
(74) *Attorney, Agent, or Firm* — Dowell & Dowell, P.C.

(57) ABSTRACT

Systems and methods of a solar light and thermal energy collector assembly are disclosed. The system includes a central pole mounted vertically on a base, a support structure having concentric racks extending radially from the central pole, the racks positioned at different vertical distances along the central pole and having a configuration that supports the solar panels, wherein each rack does not impede the passage of air and light through the rack, at least one solar panel affixed to each rack, each solar panel including a curved reflector formed at the radial edge of the solar panel, an airflow turbine disposed at the top of the central pole, the central pole having one or more apertures and ducts to direct heated air toward the airflow turbine; and electrical conductors for supplying electricity derived from photovoltaic cells in each solar panel and from the electricity-generating turbine.

20 Claims, 18 Drawing Sheets

(51) Int. Cl.
*H02S 30/10* (2014.01)
*H02S 40/42* (2014.01)
*H02S 40/38* (2014.01)
*H02S 40/22* (2014.01)

(58) Field of Classification Search
CPC ......... Y02E 10/76; H02S 10/00; H02S 10/12; H02S 10/30; H02S 40/22; H02S 40/40; H02S 40/425; H02S 40/44
See application file for complete search history.

(56) References Cited

U.S. PATENT DOCUMENTS

| | | |
|---|---|---|
| 7,888,584 B2 | 2/2011 | Lyden |
| 9,151,273 B2 | 10/2015 | Christy et al. |
| 2003/0217551 A1 | 11/2003 | Drucker |
| 2010/0289269 A1* | 11/2010 | Christy ............... F24S 25/10 290/55 |
| 2014/0021723 A1 | 1/2014 | Christy et al. |
| 2015/0155826 A1 | 6/2015 | Masaryk |
| 2016/0245265 A1 | 8/2016 | Papageorgiou |
| 2019/0040849 A1 | 2/2019 | Butler |

OTHER PUBLICATIONS

International Written Opinion, dated Oct. 18, 2019, for International Application No. PCT/CA2019/000118 filed Aug. 16, 2019.

\* cited by examiner

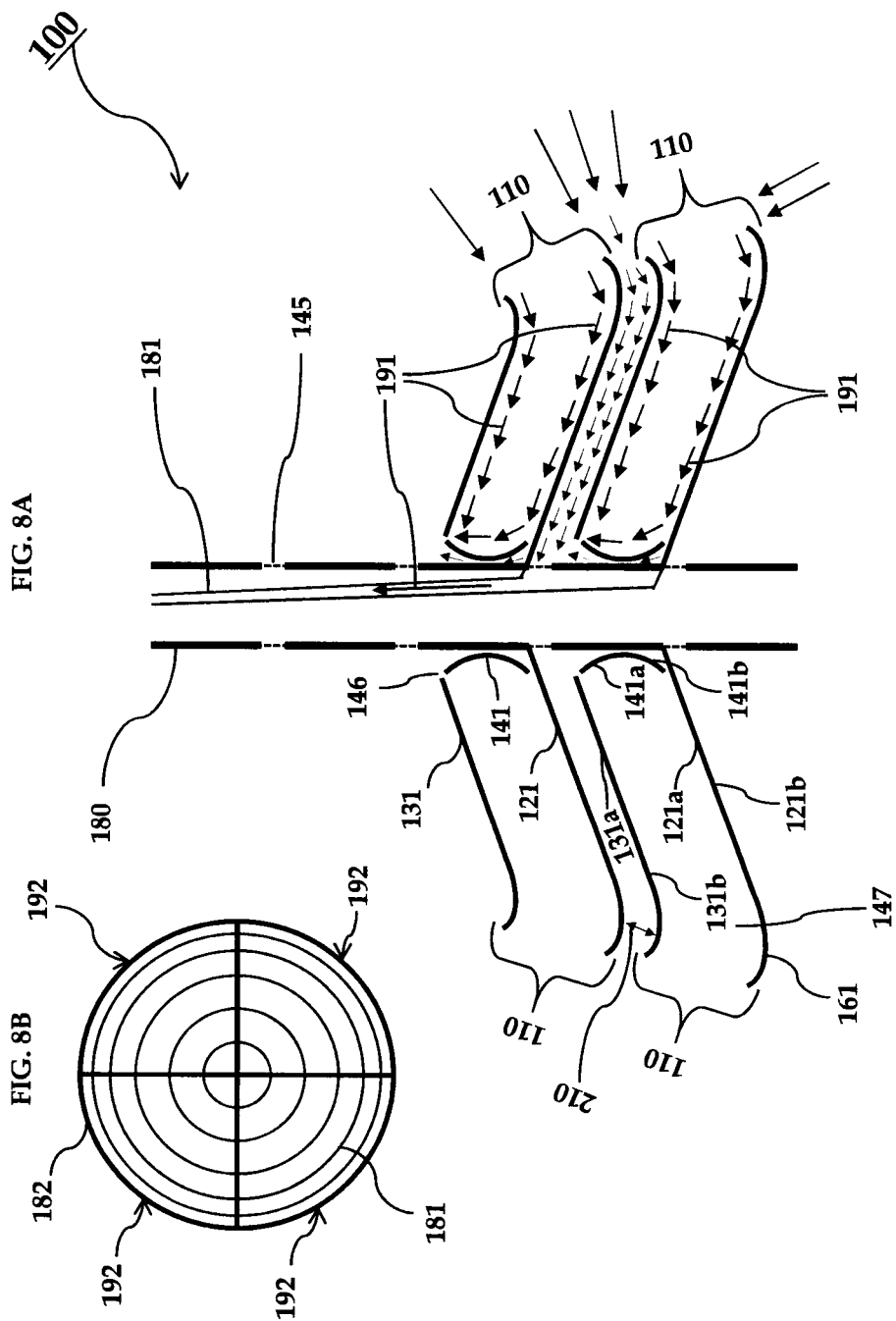

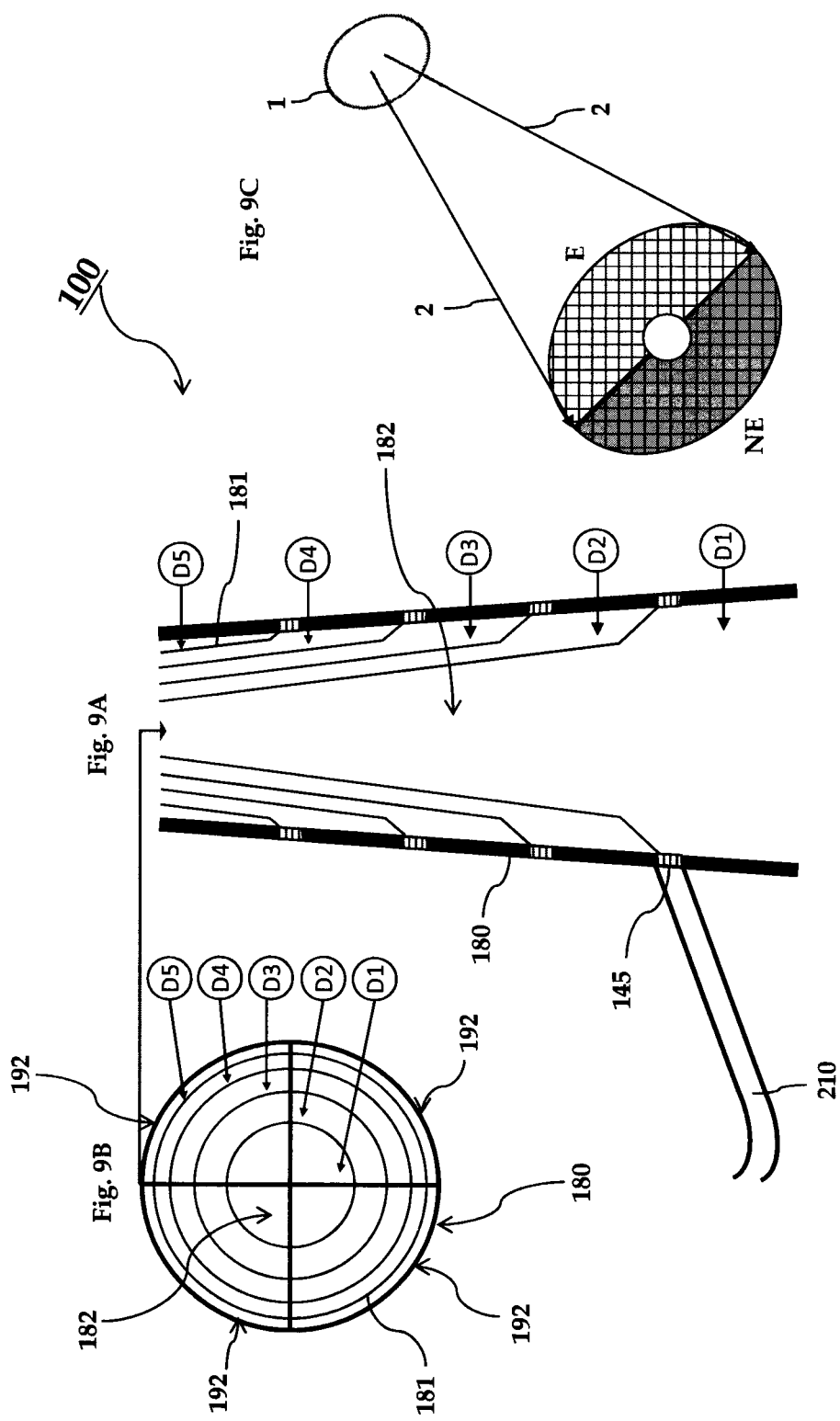

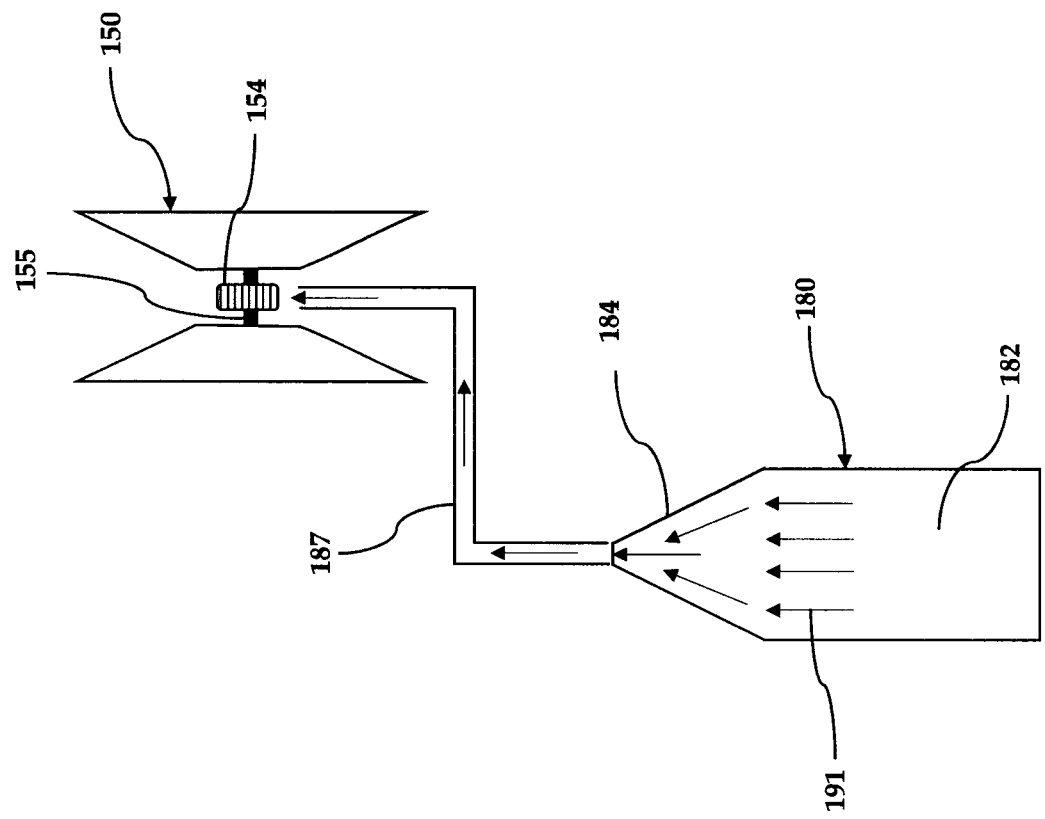
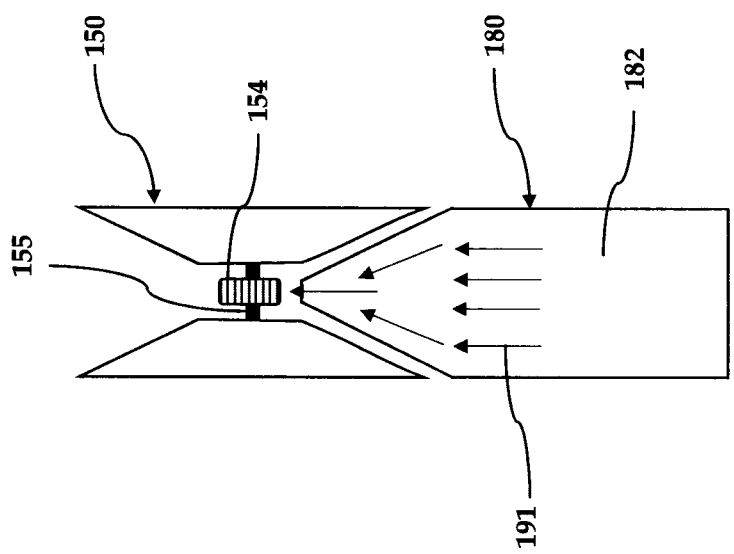

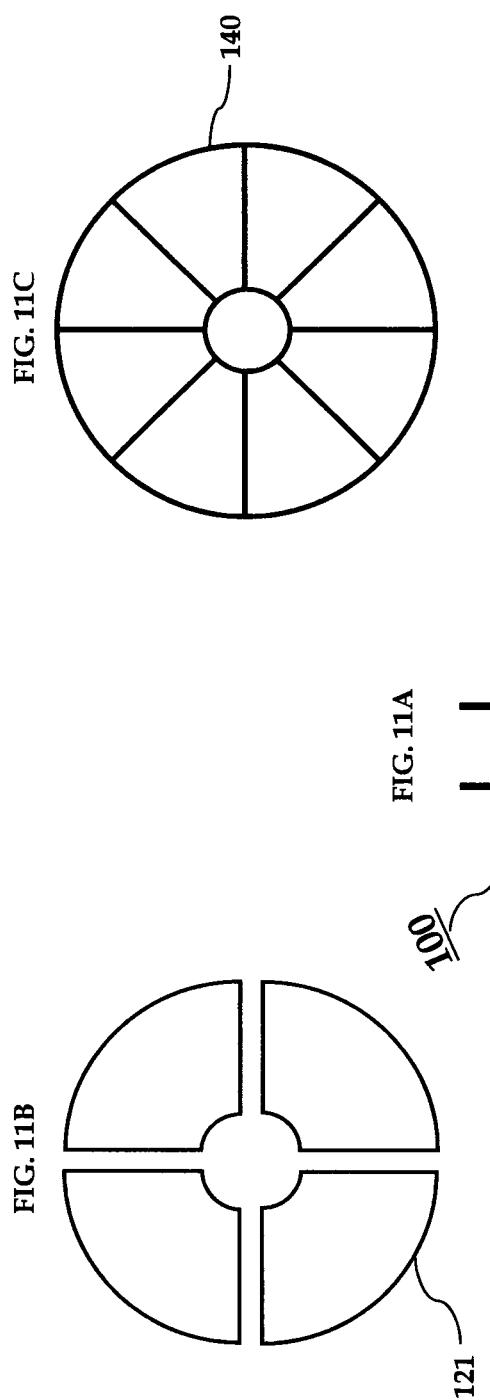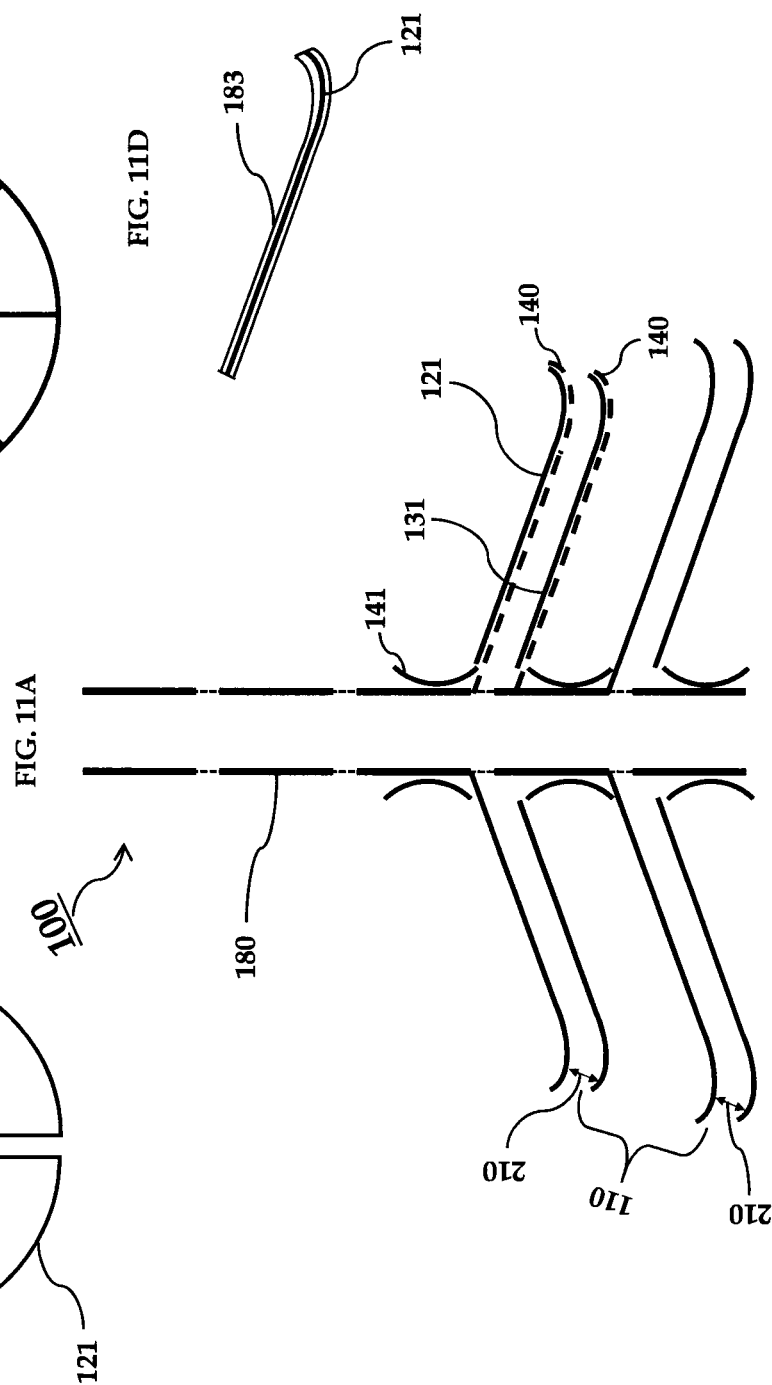

SOLAR ENERGY COLLECTOR HAVING A TREE STRUCTURE

FIELD OF THE INVENTION

The present disclosure relates in general to a solar energy conversion system that collects solar energy, including light and thermal energy, and converts the collected energy into electricity. More specifically, the present disclosure includes a solar collector system having an assembly of solar collectors open to ambient conditions and arranged in the form of a "tree" to maximize the solar energy collected.

BACKGROUND

Renewable, high-efficiency, and cost-effective sources of energy are becoming a growing need on a global scale. Increasingly expensive, unreliable, and environmentally-risky fossil fuels and a rising global demand for energy, including electricity, have created the need for alternate, secure, clean, widely available, cost-effective, environmentally-friendly, and renewable forms of energy. Solar photovoltaic (PV) electricity generation using solar cells is uniquely suited to meet the needs of residential, commercial, industrial, and centralized utility applications. Therefore, it is desired that solar cell devices in general, and solar arrays in particular, be extremely efficient. By making the solar arrays as efficient as possible, their overall acceptance will become even greater. Furthermore, the obvious environmental benefits of solar energy are further enhanced by its gain in popular use.

However, solar cell devices and solar panel assemblies have certain inefficiencies to overcome. Conventionally, solar cells are under 20% efficient, meaning more than 80% of the sunlight is reflected away. A portion of the current cost structure of solar panels is to add anti-reflective layers to the solar cells. Accordingly, it would be beneficial to provide a solar panel assembly that harnesses reflected light energy rather than reflecting it away, and that does not require costly anti-reflective layers on the solar panels.

Furthermore, after prolonged exposure to the sun, solar panels get hot and begin to lose their efficiency. As such, it would be beneficial to keep the temperature of the solar panels within optimal operating ranges.

Still further, solar panels typically lose efficiency over their lifespan. Thus, it would be beneficial to provide a solar energy collector structure in which the solar panels can be easily replaced when needed.

Accordingly, it is desired to improve the overall operation, quality, and reliability of solar panels and the structure of solar panel assemblies in particular. The technology described herein contemplates a multi-tiered approach that results in a more efficient utilization of space and may also utilize and harness thermal energy radiated from the Sun.

SUMMARY OF THE INVENTION

To address the aforementioned issues, the claimed invention aims to capture light energy and thermal energy through multiple reflections and convert that energy into electricity. That is, in the claimed invention, there is no need for expensive anti-reflective layers. Moreover, in the claimed invention, thermal energy received at the solar panel is converted into electrical energy through a chimney effect of hot air actuating a turbine generator. By doing so, it will maintain the efficiency of the solar panels by keeping them close to the ambient temperature.

The claimed invention provides numerous advantages over existing solar energy collection systems. In the claimed invention, the solar panels are placed in a tree-like structure and a clear outer shell will provide protection from the elements. The tree-like arrangement of the solar panel assembly allows the light to reflect multiple times between solar panels such that the solar panels will absorb most of the light energy. In the event that the outer shell gets discolored overtime, it can be replaced at a minimum cost. As photovoltaic technology is constantly changing, the claimed invention allows replacement or upgrade of the solar panels with ease. Further, the incline of the outer shell is much steeper relative to conventional solar panel installations, thus gravity helps to clear most obstructions and debris from the outer shell, thus maintaining efficiency. A built-in airflow system clears finer dust particles from the outer shell.

One embodiment of the claimed invention is directed to a solar energy collecting system comprising a vertical central pole including an interior cavity and one or more apertures along the height of the central pole, one or more solar panel assemblies, each solar panel assembly including a first solar panel extending radially from the central pole, a second solar panel, disposed beneath the first solar panel, extending radially from the central pole beyond the first solar panel, and a third solar panel disposed vertically between the first solar panel and the second solar panel, the third solar panel being proximate to the central pole, wherein respective free ends of the first solar panel and the second solar panel are separated by an entrance for light, an electricity-generating turbine disposed at the top of the central pole and comprised of rotating hub and a plurality of blades receiving an airflow via the interior cavity, and electrical conductors for supplying electricity derived from photovoltaic cells in each solar panel and from the electricity-generating turbine.

In some embodiments of the claimed invention, the first solar panel includes a heat conducting top surface and a photovoltaic bottom surface that absorbs and reflects light, the second solar panel includes a photovoltaic top surface that absorbs and reflects light, and a heat conducting bottom surface, and the third solar panel includes a photovoltaic outer surface that absorbs and reflects light, and a heat conducting inner surface. Two or more solar panel assemblies may be stacked concentrically at different heights on the central pole, wherein each solar panel assembly is separated by a corresponding aperture in the central pole. Further, each aperture may correspond to one of a plurality of air ducts in the interior cavity of the central pole, wherein the air ducts form a chimney with an apex that is narrower than its base. The plurality of air ducts are arranged in concentric layers and divided into a plurality of segments.

In additional embodiments of the claimed invention, heat conducting surfaces of the solar panels channel hot air into the interior cavity through the apertures. Hot air rising through the plurality of air ducts may be concentrated by a nozzle into a hot air stream. The hot air stream may impart a force onto the plurality of blades actuating rotation of the turbine.

In other embodiments of the claimed invention, the solar panel assembly includes a perforation on at least one end of the third solar panel allowing hot air to escape. Further, respective free ends of the first solar panel and the second panel may each include an upward curvature configured to reflect light to the solar panel assembly. Still further, the first and the second panels are spaced apart such that light can reflect multiple times between photovoltaic surfaces of each solar panel assembly. One or more light dispersion mediums may be disposed in the space between the first solar panel and the second solar panel proximate the respective free ends.

In some arrangements of the claimed invention, all adjacent solar panel assemblies are arranged such that the perimeter of the bottom solar panel of one solar panel assembly does not extend beyond the perimeter of the top solar panel of an adjacently lower solar panel assembly. A base may be provided for mounting the central pole, wherein the base includes at least one battery for storing electrical energy, a power inverter, and an air pump. A clear shell may cover one or more solar panel assemblies and electricity-generating turbine for protection. The clear shell may allow the entrance of ambient air through an air filter, wherein the clear shell has openings where the incoming ambient air can exit the system and mix with ambient air. The clear shell may include ducts to spray air streams on the outer surface.

Embodiments of the claimed invention may further include racks supporting the first solar panel, the second solar panel and the third solar panel, wherein the racks include openings that do not impede the passage of air and light.

Another embodiment of the invention is directed to a method for creating electricity from a solar panel and hot air turbine, the method comprising the steps of: stacking a plurality of solar panels concentrically around a central pole, wherein the solar panels are spaced apart vertically and arranged to form a conical structure, connecting the apertures in the central pole with a nozzle through a plurality of air ducts in the central pole to impart air onto an airflow turbine, and supplying energy collected from the solar panels and airflow turbine.

Yet another embodiment of the claimed invention is directed to an apparatus for generating electricity, comprising a central pole mounted vertically on a base, a support structure having concentric racks extending radially from the central pole, the racks positioned at different vertical distances along the central pole and having a configuration that supports the solar panels, wherein each rack does not impede the passage of air and light through the rack, at least one solar panel affixed to each rack, each solar panel including a curved reflector formed at the radial edge of the solar panel, an airflow turbine disposed at the top of the central pole, the central pole having one or more apertures and ducts to direct heated air toward the airflow turbine, and electrical conductors for supplying electricity derived from photovoltaic cells in each solar panel and from the electricity-generating turbine.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

Further characteristics and advantages of the claimed invention will become better apparent from the description of preferred but not exclusive embodiments of the proposed solar panel, illustrated only by way of non-limitative example in the accompanying drawings, wherein:

FIG. 8A is a detailed cross-section view of the solar energy collector assembly and airflow in the system, in accordance with an embodiment of the claimed invention;

FIG. 8B is a top plan view of air ducts in the central pole of the solar energy collector assembly, in accordance with an embodiment of the invention.

FIG. 9A is a detailed cross-section view of the solar energy collector assembly and air ducts, in accordance with an embodiment of the claimed invention;

FIG. 9B is a top plan view of air ducts in the central pole of the solar energy collector assembly, in accordance with an embodiment of the invention;

FIG. 9C is an illustration of sunlight exposure on the solar energy collector assembly;

FIG. 10A is a detailed cross-section view of the turbine system of the solar energy collector assembly illustrating hot airflow actuation of a turbine, in accordance with an embodiment of the claimed invention;

FIG. 10B is a detailed cross-section view of the turbine system of the solar energy collector assembly illustrating hot airflow actuation of a turbine, in accordance with another embodiment of the claimed invention;

FIG. 11A is a detailed cross-section view of the solar panel assembly configuration, in accordance with an embodiment of the claimed invention;

FIG. 11B is a top plan view of a circular solar panel configuration, in accordance with an embodiment of the claimed invention;

FIG. 11C is a top plan view of a solar panel rack, in accordance with an embodiment of the claimed invention;

FIG. 11D is a partial cross-section view of a solar panel and clear case configuration, accordance with an embodiment of the claimed invention;

DETAILED DESCRIPTION OF THE PREFERRED EMBODIMENTS

Figure 1:
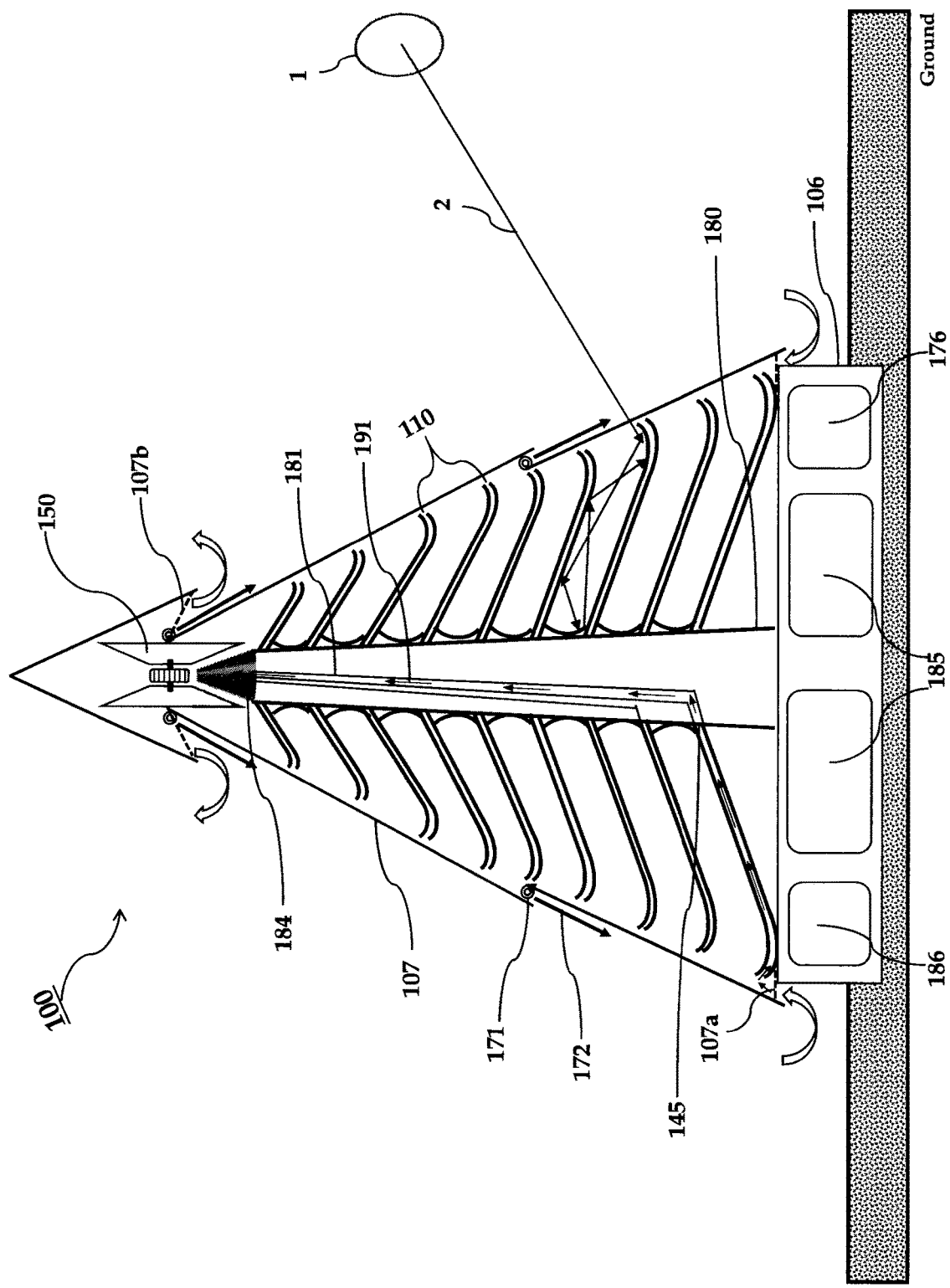
FIG. 1 is a schematic view of the overall structure of a solar energy collector assembly, in accordance with an embodiment of the claimed invention.

Embodiments of the present invention will now be described more fully hereinafter with reference to the accompanying drawings in which embodiments of the invention are shown. This invention may, however, be embodied in many different forms and should not be construed as limited to the illustrated embodiments set forth herein. Rather, the embodiments described herein are provided so that this disclosure will be thorough and complete, and will fully convey the full scope of the invention to those skilled in the art. Like numbers refer to like elements throughout. For the convenience in referring to the accompanying figures, directional terms are used for reference and illustration only. For example, the directional terms such as "upper", "lower", "above", "below", "top", "bottom", and the like are being used to illustrate a relational location.

"Generally conical" relative to descriptions of solar panels means an overall conical shape with increasing width from top to bottom of the shape, regardless of a removed apex portion, similar to an upside-down funnel, or curvature upwards at a circumference of a base of an overall conical shape.

It is to be understood that the invention is not limited to the exact details of construction, operation, exact materials, or embodiments shown and described, as modifications and equivalents will be apparent to one skilled in the art. In the drawings and specification, there have been disclosed illustrative embodiments of the invention and, although specific terms are employed, they are used in a generic and descriptive sense only and not for the purpose of limitation.

Unless otherwise defined, all terms (including technical and scientific terms) used herein have the same meaning as commonly understood by one of ordinary skill in the art to which this inventive disclosure belongs. It will be further understood that terms, such as those defined in commonly used dictionaries, should be interpreted as having a meaning that is consistent with their meaning in the context of the relevant art and/or the present specification.

Referring to FIG. 1, a preferred embodiment of a solar energy collector system 100 comprises a plurality of solar panel assemblies 110 that are generally conical and arranged and attached concentrically to a vertical central pole 180 that may be mounted in the ground or to a base 106. The central pole 180 includes one or more inner cavities containing hot air ducts 181 for collecting and ventilating hot air from the system 100. Light 2, represented by arrows, from the Sun 1 is reflected off of multiple reflective surfaces of each solar panel assembly 110 multiple times. Multiple reflections of light increases thermal and light energy absorbed by panels of each assembly 110. A diameter of a solar panel assembly 110 located toward the top of the system 100, where an airflow turbine 150 is located, is generally smaller relative to a solar panel assembly located toward the bottom of the system, such that the overall shape of the solar energy tree system 100 is generally conical.

The solar energy collector system 100 may be encapsulated in a clear outer shell 107 to protect the system from the elements. Ambient air may enter the shell 107 through openings 107a that are configured with an air filter (represented by dashed lines) to filter the air entering the system. As the air enters the system, it is heated through contact with the solar panel assemblies 110, and enters the central pole 180 through apertures 145 that lead to hot air ducts 181. The hot air rises to the top of the system 100, creating a "chimney" effect. A nozzle 184, preferably having a generally conical shape, collects and concentrates the hot airflow rising through the central pole 180 to amplify the force of that airflow as it is imparted onto constituent blades 154 of an electricity-generating airflow turbine 150. The airflow causes the blades to rotate, and the rotational energy of the airflow turbine 150 is converted into electrical energy. Subsequently, the hot air escapes the system 100 through exhaust conduits 107b.

Figure 12:
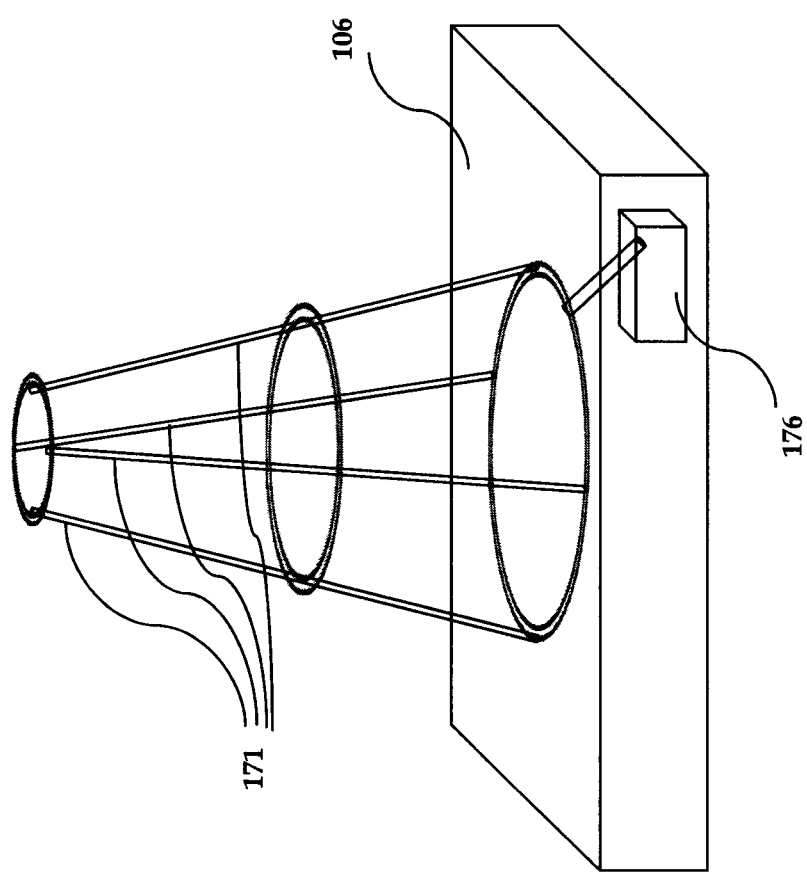
FIG. 12 is a schematic view of an air-blowing duct system for cleaning the solar energy collector, in accordance with an embodiment of the claimed invention.
Figure 13D:
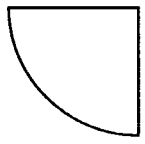
FIG. 13D is a top plan view of a solar panel, in accordance with an embodiment of the claimed invention.
Figure 13H:
FIG. 13H is a top plan view of a solar panel, in accordance with an embodiment of the claimed invention.
Figure 13C:
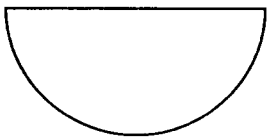
FIG. 13C is a top plan view of a solar panel, in accordance with an embodiment of the claimed invention.
Figure 13G:
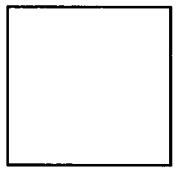
FIG. 13G is a top plan view of a solar panel, in accordance with an embodiment of the claimed invention.
Figure 13B:
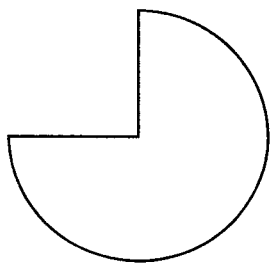
FIG. 13B is a top plan view of a solar panel, in accordance with an embodiment of the claimed invention.
Figure 13F:
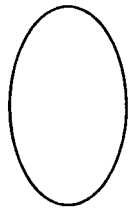
FIG. 13F is a top plan view of a solar panel, in accordance with an embodiment of the claimed invention.
Figure 13J:
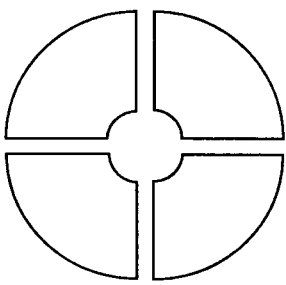
FIG. 13J is a top plan view of a solar panel, in accordance with an embodiment of the claimed invention.
Figure 13A:
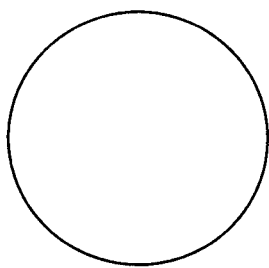
FIG. 13A is a top plan view of a solar panel, in accordance with an embodiment of the claimed invention.
Figure 13E:
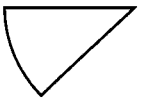
FIG. 13E is a top plan view of a solar panel, in accordance with an embodiment of the claimed invention.
Figure 13I:
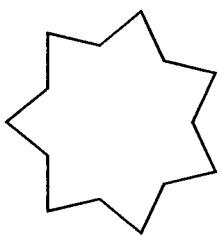
FIG. 13I is a top plan view of a solar panel, in accordance with an embodiment of the claimed invention.

The central pole 180 is mounted vertically on a base 106. The base 106 may house one or more batteries 185 electrically connected to one or more solar panels of the system and/or the airflow turbine 150 for storing the electrical energy captured via the solar panels and the airflow energy captured and converted via the airflow turbine 150. The base 106 may further house an inverter 186 for converting DC energy produced by the system 100 into AC energy that is usable by conventional electric systems of a building or power grid. The base 106 may further house an air pump 176 for injecting air into air ducts 171 that then expel air to create an airflow 172 (indicated by arrows in FIG. 1) to clean the outer shell 107, as illustrated in FIG. 12 in greater detail.

The central pole 180 can be made with one or more materials. For example, such materials include metal, ceramic, concrete, resin, plastic, composite material, wood, wood composite, glass, rubber, carbon, etc. The base 106 can be made with one or more materials, such as, for example, metal, ceramic, concrete, resin, plastic, composite material, wood, wood composite, glass, rubber, carbon, etc. The outer shell 107 can be made with one or more materials, but primarily made with transparent materials, such as, for example, glass, acrylic, resin, composite materials, etc. The shell 107 can include some parts made with non-transparent materials, such as, for example, metal, ceramic, concrete, resin, plastic, composite material, wood, wood composite, glass, rubber, carbon, etc. Such non-transparent materials form parts used in a frame and frame components that support and stabilize the shell 107.

Figure 2:
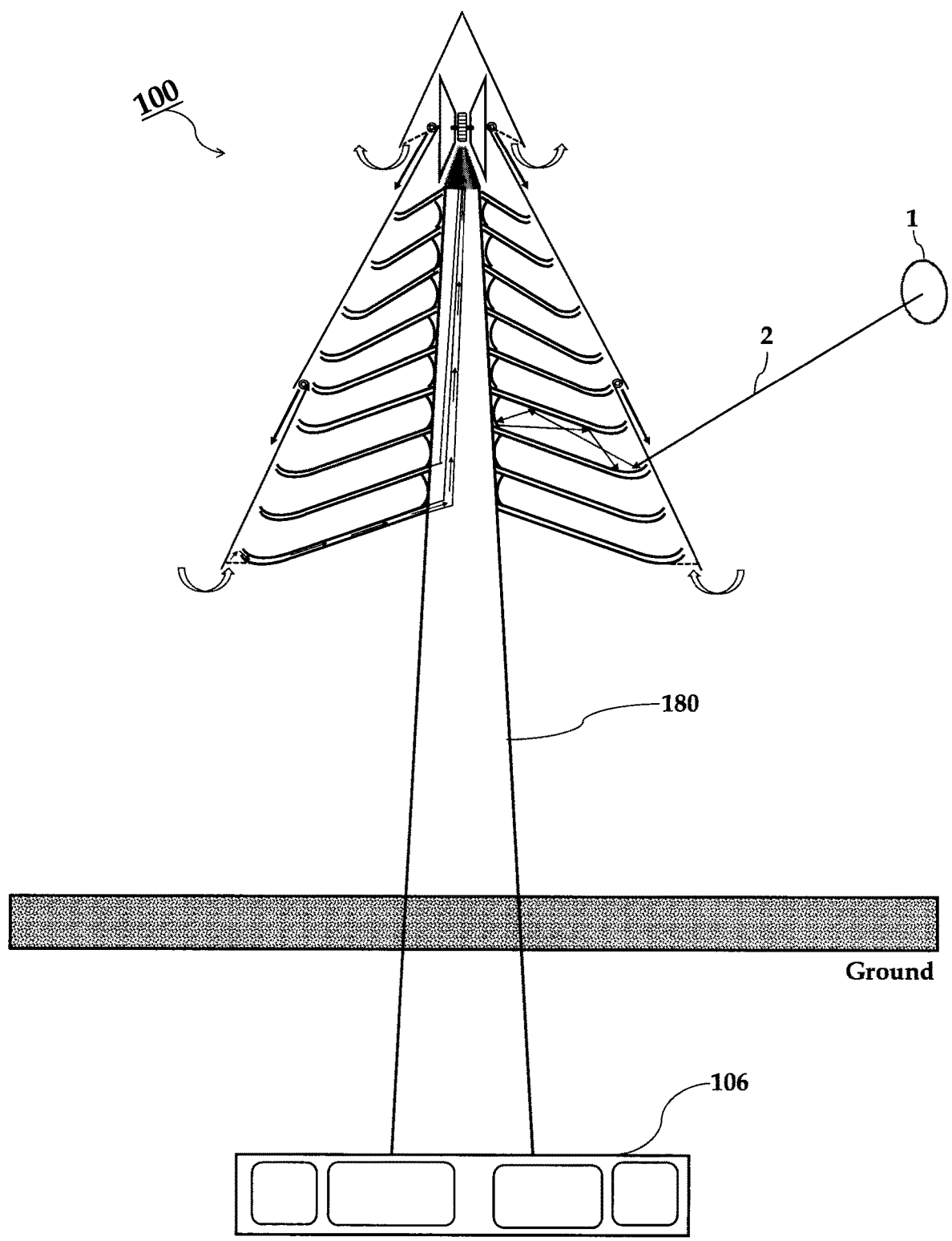
FIG. 2 is a schematic view of the overall structure of a solar energy collector assembly, in accordance with another embodiment of the claimed invention.

Referring to FIG. 2, an alternate embodiment of the solar energy tree system 100 is illustrated to demonstrate that the proportions and installation of the system may vary to fit different standards or preferences, as desired. All other components of the system shown in FIG. 2 are the same as the system of FIG. 1, however, the base 106 and its components, as identified in FIG. 1, may be disposed in the ground or underground to conserve a footprint of the system 100. Further, the central pole 180 may be of varying height and/or may include a varying number of solar panel assemblies 110.

Figure 3A:
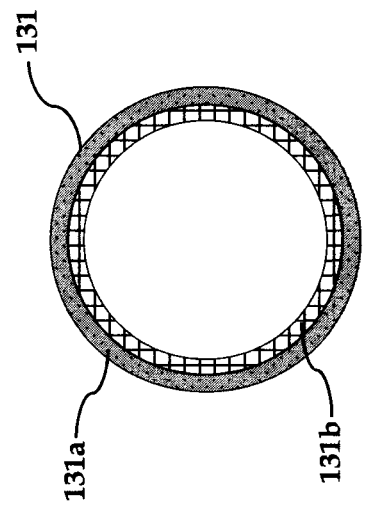
FIG. 3A is a bottom view of a solar panel illustrating a thickness at a circumference of the panel.
Figure 3B:
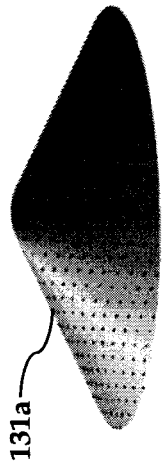
FIG. 3B is a top perspective view of the solar panel of FIG. 3A
Figure 3C:
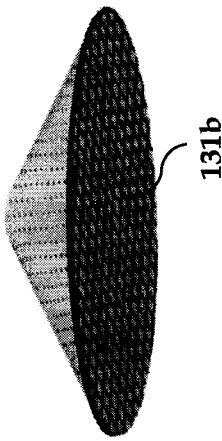
FIG. 3C is a bottom perspective view of the solar panel of FIG. 3A
Figure 3D:
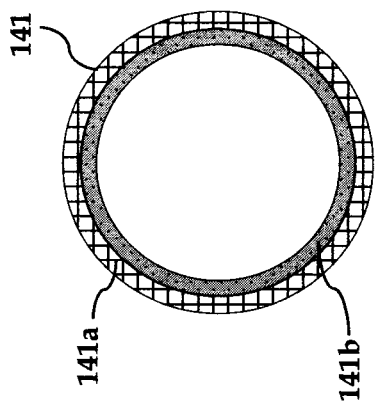
FIG. 3D is a bottom view of a side solar panel illustrating a thickness at a circumference of the panel.
Figure 3E:
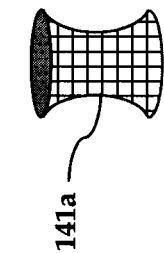
FIG. 3E is a top perspective view of the side solar panel of FIG. 3D.
Figure 3F:
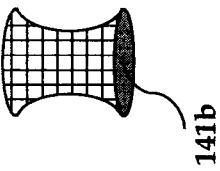
FIG. 3F is a bottom perspective view of the side solar panel of FIG. 3D.
Figure 3G:
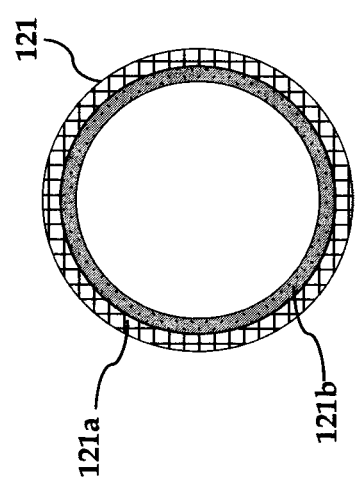
FIG. 3G is a bottom view of a solar panel illustrating a thickness at a circumference of the panel.
Figure 3H:
FIG. 3H is a top perspective view of the solar panel of FIG. 3G.
Figure 3I:
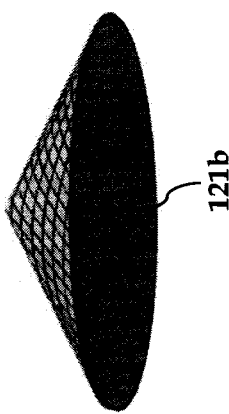
FIG. 3I is a bottom perspective view of the solar panel of FIG. 3G.

FIG. 3A-3I provides different views of components of a solar panel assembly 110 embodiment, namely a bottom panel 121, side panel 141, and top panel 131. FIGS. 3A-3C depict different view of the bottom panel 121. Cross-hatched surface shading indicates photovoltaic material for absorbing light energy. Dotted surface shading indicates heat conducting material. FIG. 3A shows a bottom view of the bottom panel illustrating a thickness at a circumference of the panel, where an outer or upper layer 121a is a photovoltaic material and an inner or lower layer 121b is a heat conducting surface or material. FIG. 3B shows a top view of the bottom panel 121 with the outer photovoltaic surface 121a. FIG. 3C shows a bottom view of the bottom panel 121 with the inner heat conductive layer 121b. FIG. 3G shows a bottom view of the top solar panel 131 illustrating a thickness at a circumference of the panel, where an outer or upper layer 131a is a heat conductive material layer and an inner or lower layer 131b is a photovoltaic layer or material. FIG. 3H shows a top view of the top panel 131 with the outer heat conductive surface 131a. FIG. 3I shows a bottom view of the top panel 131 with the inner photovoltaic layer 131b. FIG. 3D shows a bottom view of the side solar panel 141 illustrating a thickness at a circumference of the panel, where an outer layer 141a is a photovoltaic layer or material and an inner layer 141b is a heat conductive layer or material. A top view of the side solar panel 141 would be the same as FIG. 3D. In FIGS. 3E and 3F, the hyperboloid structure and shape of the side solar panel is shown, with the outer surface 141a being photovoltaic and inner surface 141b being heat conductive.

Figure 4:
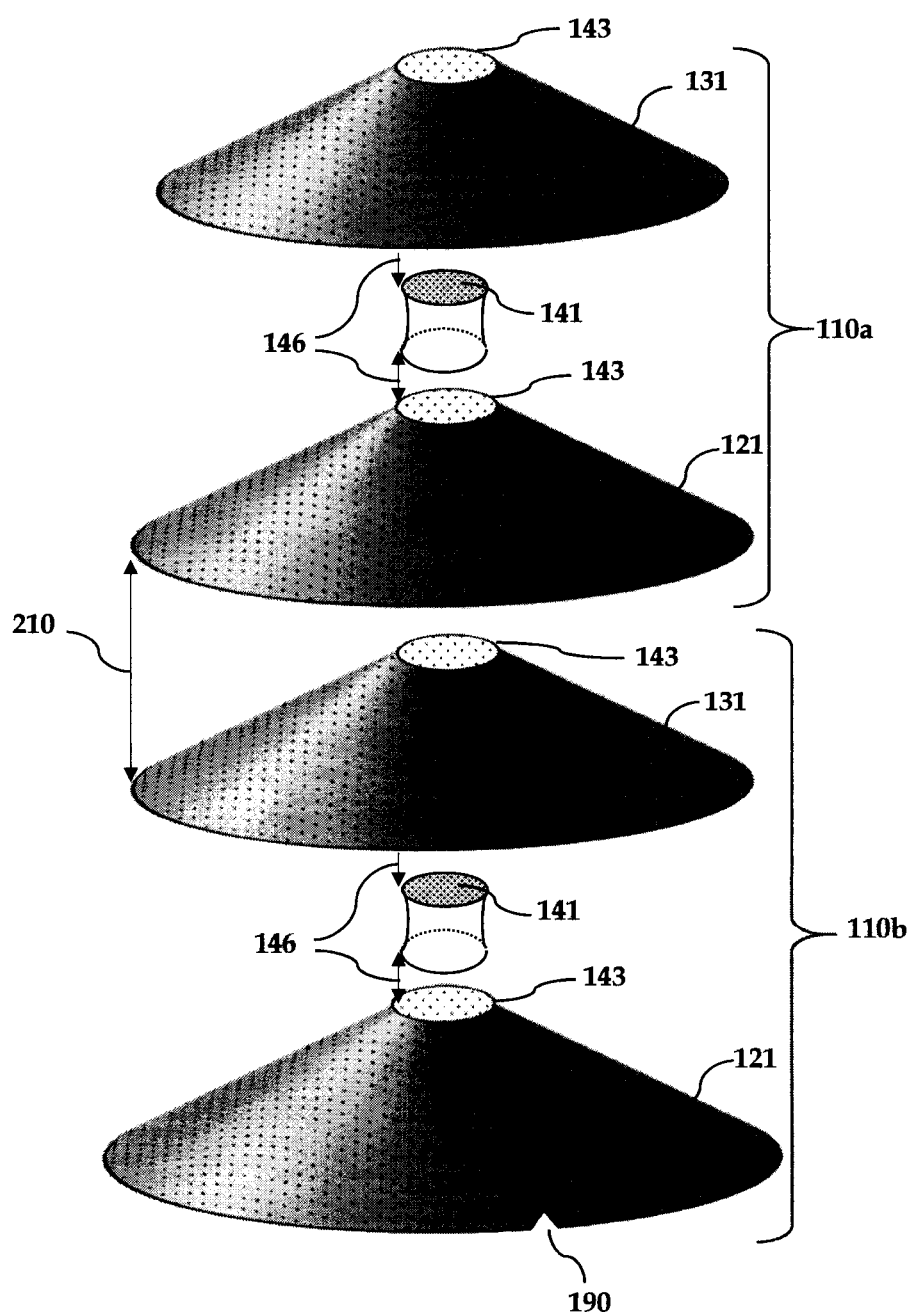
FIG. 4 is an exploded view of the configuration of two solar panel assemblies, each having two conical solar panels and a side solar panel, in accordance with an embodiment of the claimed invention.

FIG. 4 illustrates an exploded view of two solar panel assemblies 110, assembly 110a and assembly 110b. In each assembly 110a and 110b, the circular or elliptical bottom solar panel 121 is disposed below the side solar panel 141 and separated from the side solar panel, at least partly, by a perforation 146. The circular or elliptical top solar panel 131 is disposed above the same side solar panel 141 and separated, at least partly, from the side panel by similar perforation 146 in each solar panel assembly 110a and 110b. While FIG. 4 shows an exploded view of the assemblies 110a and 110b, each assembly is typically arranged such that the apical opening 143 of the top panel 131 is separated vertically from the apical opening of the bottom panel 121 by the height of the side panel 141. Each perforation 146 allows heat to escape from a cavity 147 into a passage 210 between multiple assemblies arranged in a system, such as between panel 121 of assembly 110a and panel 131 of assembly 110b. In some embodiments, solar panels 121 and/or 131 may include a light reflecting ridge 190, such as on panel 121 of assembly 110b extending radially from the center of the panel to the circumference. One or more ridges 190 may be employed on the panel to maximize the amount of exposure to sunlight. Further, panels 121, 131, and 141 of each assembly 110a and 110b have photovoltaic and heat conductive layers or surfaces as shown and described by FIGS. 3A-3I.

In each assembly 110a and 110b, the diameter of the top solar panel 131 is less than or at most equal to the diameter of the bottom solar panel 121. Where the solar panels 121 and 131 are elliptical in shape, the diameter refers to the mean diameters of the panels 121 and 131. Where the assemblies do not conform to a circular or elliptical shape, the diameter refers to the maximum length that the panels 121 and 131 of an assembly 110 extend radially from the central pole 180.

Moreover, to allow each assembly 110 to receive light and impart the tree-like structure, the overall maximum diameter of each successive assembly 110 is greater than the preceding assembly relative to and approaching the ground. The overall maximum diameter refers to the diameter of the bottom panel 121 of the solar panel assembly 110. Where the assemblies 110 are elliptical in shape, the overall maximum diameter refers to the mean diameter of the bottom solar panel 121 of assembly 110. Where the assemblies do not conform to a circular or elliptical shape, the overall maximum diameter refers to the maximum length the bottom solar panel 121 of the assembly 110 extending radially from the central pole 180. Generally, it will be understood that the increasing size of each assembly 110 as they are successively located proximate the ground will impart a triangular cross-section shape as exhibited in FIG. 1, for example. As such, the diameter of panel 121 in assembly 110b would be larger than the diameter of panel 121 in assembly 110a of FIG. 4.

Figure 5:
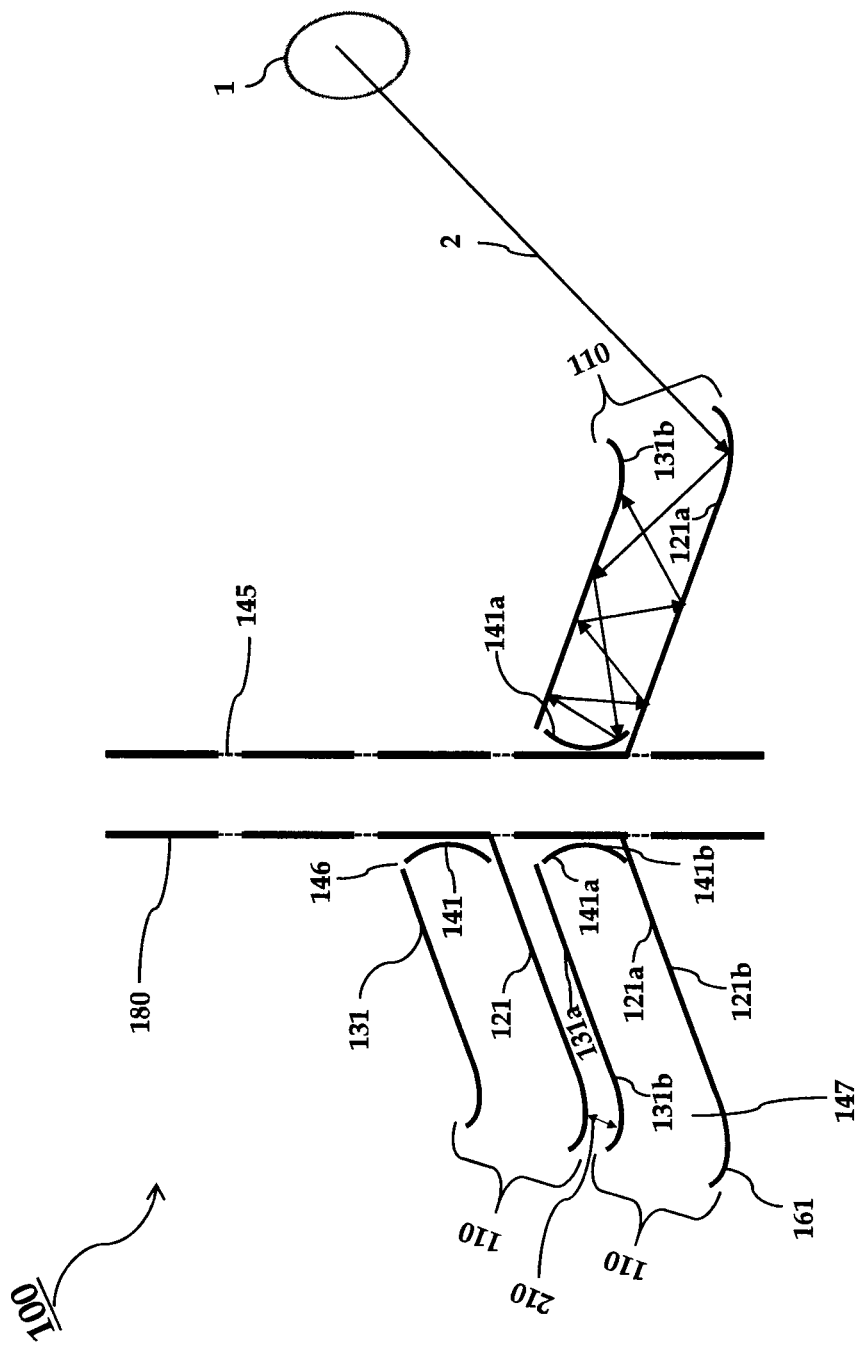
FIG. 5 is a detailed cross-section view of the solar energy collector assembly and light interaction therein, in accordance with an embodiment of the claimed invention.

Referring to FIG. 5, an embodiment of the system 100 has several solar panel assemblies 110 having generally conical solar panels 121 and 131 arranged around a circumference of the central pole 180, wherein the solar panels 121 and 131 of each assembly 110 extend radially away from the longitudinal axis of the central pole and slope downward relative to a point of attachment to the central pole. As such, each tier of solar panels of the assembly 110 may form a generally conical shape, wherein the free ends of each tier are circumscribed by the base of the cone relative to a vertex defined by the attachment point, in reference to the longitudinal axis of the central pole. An upper assembly 110 is shown only on the left side of the central pole in FIG. 5 to demonstrate how the two vertically adjacent assemblies are positioned. As the panels 121 and 131 in this embodiment of the system 100 are generally conical, wherein an apex of a cone is missing to allow the panels to be inserted over the central pole through an apical opening, the upper assembly would have a mirrored structure on the right side of the central pole.

The central pole is oriented vertically or substantially vertically relative to the ground. Each solar panel 121, 131, and 141 comprises at least one individual solar panel, but each preferably includes an arrangement of multiple individual solar panel portions, which are supported by one or more rigid structures attached to the central pole. The rigid structure may support both solar panels 121 and 131 as a unified assembly, or each solar panel 121, 131 may be supported by a separate corresponding rigid structure. The side solar panel 141 is disposed vertically between the two tiers and proximate to the central pole 180. The solar panels 121 and 131 with the intervening side panel 141 may form a unified construction or individual components.

Still referring to FIG. 5, in a preferred embodiment each solar panel assembly 110 comprises two solar panels 121 and 131 stacked concentrically and a side panel 141 disposed between panels 121 and 131 proximate the central pole 180. In each assembly 110, the lower or bottom solar panel 121 has a light-absorbing and reflecting top surface 121a, also referred to as a photovoltaic surface, and a heat conducting bottom surface 121b to capture thermal energy. The upper solar panel 131 has a light-absorbing and reflecting bottom surface 131b and a heat conducting top surface 131a to capture thermal energy. A side solar panel 141 providing a light-absorbing and reflecting outer surface 141a and a heat conducting inner surface 141b to capture thermal energy is disposed proximate the central pole 180 and between panels 121 and 131. Light is received in a cavity 147 having three sides defined by the lower solar panel 121, the upper solar panel 131, and the side panel 141 of an assembly 110, and having a generally U-shaped cross section, wherein light enters the cavity through a gap defined by the free ends of the panels 121 and 131. A preferred embodiment of the assembly 110 includes a continuous curvature 161 at free ends, or at the circumference, of each of solar panel 121 and 131 curving upwards toward the sky to enable the capture and reflection of additional sunlight into the cavity 147. The curvature 161 reflects light back onto the solar panel assembly, and is especially useful at reflecting light into the cavity 147 while the Sun 1 is positioned high in the sky around solar noon. Otherwise, generally horizontal solar panels stacked vertically on top of each other will lose efficiency during such times as inner portions of those structures are not receiving light. The radial length of the lower panel 121 may be longer than the radial length of upper panel 131 to maximize light capture.

As represented by arrows from the Sun 1 in FIG. 5, sunlight 2 enters the cavity 147 of an assembly 110 and reflects multiple times between bottom surface 131b of solar panel 131, the outer surface 141a of side solar panel 141, and the top surface 121a of solar panel 121 in the same assembly 110. Therefore, most of the Sun's light energy will be absorbed by these panels. Embodiments of the claimed invention may utilize flat, conical or convex solar panels. The solar panels 121, 131, and 141 can be constructed as one assembly. Side panel 141 can be combined with panels 121 and 131. A perforation 146 in the solar panel assembly 110 at one or both ends of side panel 141 allows heat to escape from the cavity 147 of the solar panel assembly 110 and from behind side panel 141. Each solar panel assembly 110 may further comprise racks 140 to hold the solar panels 121 and 131, discussed below with respect to FIG. 11A-11D.

By way of example and not limitation, the interaction between two adjacent solar panel assemblies 110 is further described with reference to FIGS. 6, 7, and 8A-8B.

Figure 6:
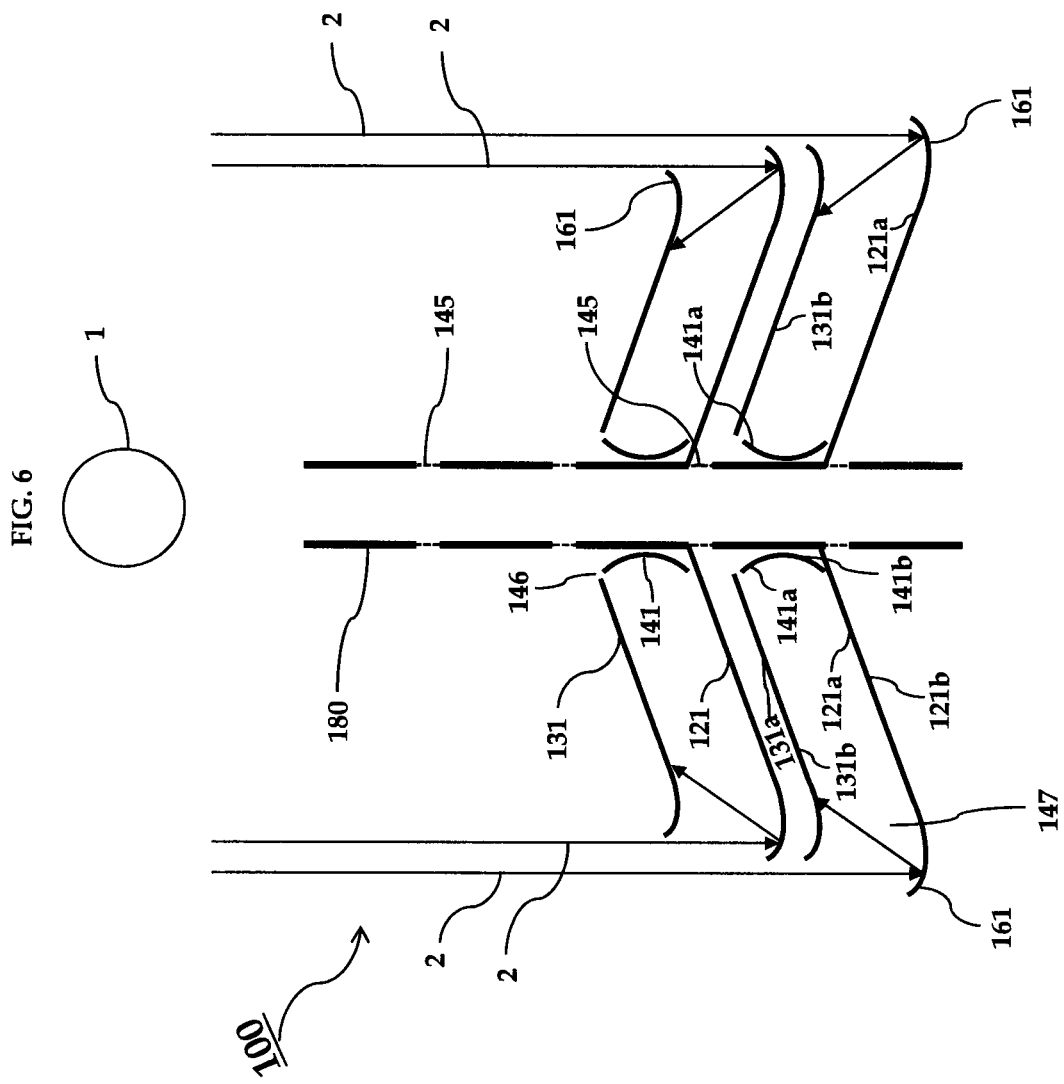
FIG. 6 is a detailed cross-section view of the solar energy collector assembly and light interaction therein, in accordance with an embodiment of the claimed invention.

FIG. 6 illustrates the beneficial properties of the curvature 161 at the free ends of each of solar panel 121 and 131, wherein the Sun 1 is positioned at or around solar noon relative to the system 100. Sunlight 2 is directed downwards at a substantially 90° angle to the ground, representing how light during midday would interact with the assemblies 110 and system 100. As the free ends of each solar panel 121 and 131 have a curvature 161, light is directed into the cavity 147. Without the curvature 161 at the free ends of each solar panel 121 and 131, light absorption would only be optimal for a portion of daylight hours in the morning and afternoon, wherein the bottom solar panel 121 would be angled to optimally reflect sunlight into the cavity 147. With the curvature, angles are provided along the bottom solar panel 121 such that optimal absorption is possible across all daylight hours.

Figure 7:
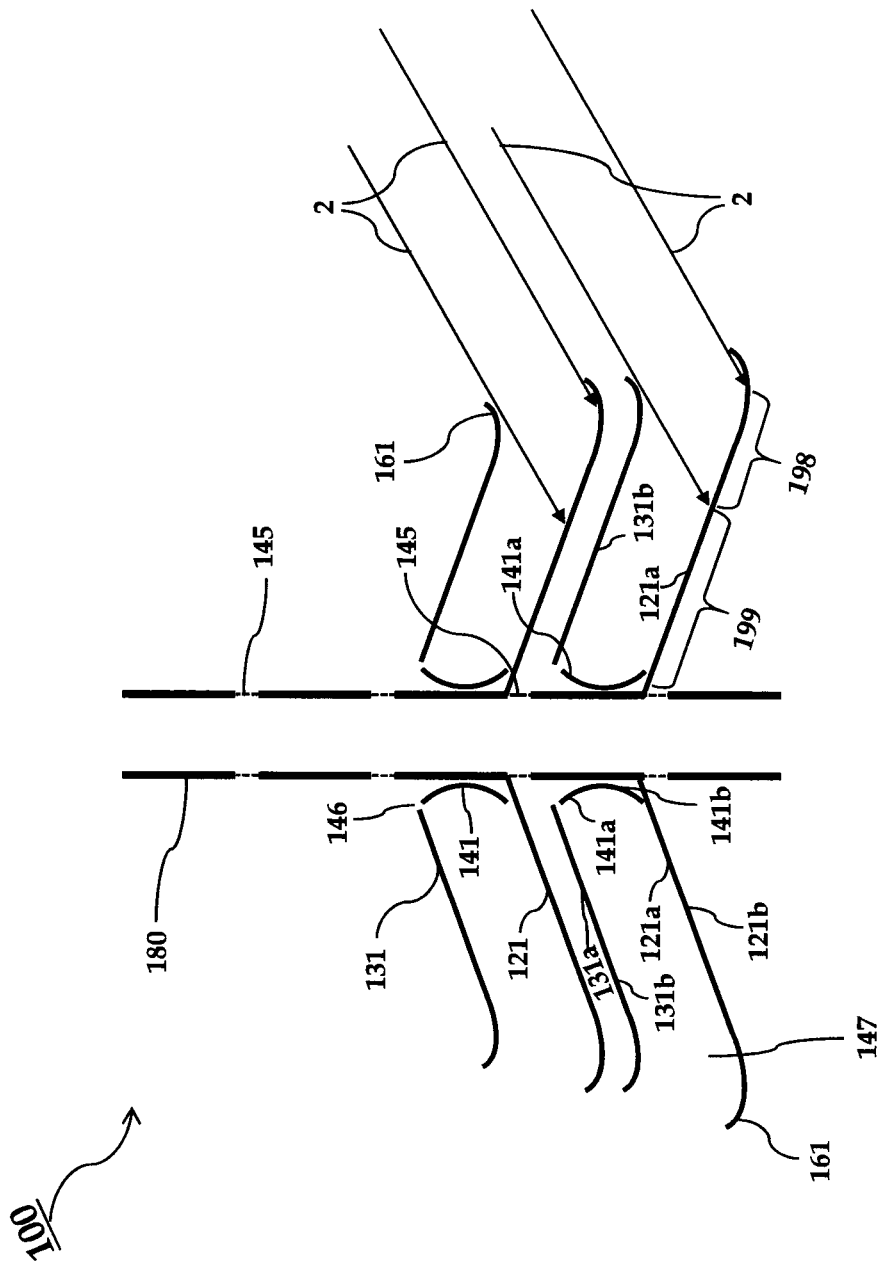
FIG. 7 is a detailed cross-section view of the solar energy collector assembly and heat conduction therein, in accordance with an embodiment of the claimed invention.

FIG. 7 illustrates solar panel exposure to sunlight 2 and corresponding heat transfer in the system 100. During direct exposure to sunlight 2, an exposed length 198 of each bottom panel 121 being exposed to direct sunlight will be hotter than an unexposed length 199 of the panel 121. Heat from the exposed length 198 of each panel 121 will transfer to the remaining unexposed length 199 through conduction. Remaining unexposed lateral surface area of the bottom panel 121 not exposed to sunlight will further act as a heat sink to conduct heat. Heat in the panels 121, 131, 141 is transferred to air inside each cavity 147 to promote air flow through the apertures 145 that lead to hot air ducts 181.

In FIG. 8A, a first solar panel assembly 110 is illustrated above and adjacent to second solar panel assembly 110 to demonstrate movement of heat and hot air 191 flow between two solar panel assemblies 110 within the system 100. For the purposes of the present invention, hot air 191 is ambient air heated in the cavity 147 and passage 210 through conductive heat transfer when heat is transferred from the panels 121, 131, and 141 and from sunlight 2 entering the cavity 147. A passage 210 is formed between surface 121b of an upper assembly 110 and surface 131a of a lower assembly 110, with the passage extending from free ends of the lower panel 121 of the upper assembly 110 and the upper panel 131 of the lower assembly 110 to the central pole 180 and through an aperture 145.

Still referring to FIG. 8A, ambient air in the cavity 147 and passage 210 is heated as it contacts the surfaces of panels 121, 131, and 141 thus creating a hot air 191 stream. Hot air 191 in the cavity 147 exits the cavity through perforation 146 and into passage 210 and through aperture 145 of the central pole 180. The generally conical shape of each panel 121 and 131 allows hot air 191 to travel upwards, as hot air rises due to expansion and density differences, through the perforations 146, and through the apertures 145, which are positioned along the central pole at a top of the passage 210. The hot air 191 stream is directed into one of a plurality of hot air ducts 181 in a vertical chimney 182 formed by one or more hot air ducts extending vertically upwards within the central pole 180. Each passage 210 between solar panel assemblies 110 corresponds to a separate duct 181 to allow the hot air stream to enter the chimney 182. When exposed to the sun, the surfaces of panels 121 and 131 will be hotter than the ambient air. Therefore, the air touching on both sides of the surfaces of panels 121 and 131 will heat faster relative to the ambient air and will rise.

Referring to FIG. 8B, in some embodiments the hot air ducts 181 may be arranged as concentric circles within chimney 182 of the central pole 180. Each layer of hot air ducts 181 in the chimney 182 may be divided into two or more segments 192. FIG. 8B shows an embodiment of the chimney divided into four segments 192. At a given time, a portion of each solar panel will be exposed to the Sun 1. Relative to an unexposed portion 199 of each solar panel, ambient air will heat and rise faster around the exposed portion 198. As hot air 191 flows into the chimney 182, each segment 192 will maintain the difference in air temperature and the air speed. The inner most circle in FIG. 8B is linked to the lowest panel assembly 110 and the outer most circle is linked to the highest panel assembly 110. The lowest panel assembly 110 is the widest, hence it will generate the maximum air flow and vice versa. To accommodate more hot air 191 flow, more volume within the chimney 182 is required for the inner most ring. A generally conical chimney 182, with a broader base relative to a narrower apex, will increase the performance of the system. However, the chimney 182 can be cylindrical, with a straight tube-like structure. Alternatively, the chimney 182 with a narrower base relative to a wider apex is envisioned.

FIG. 9A illustrates a more detailed cross-sectional view of the central pole 180 of the preferred embodiment of the system 100 having a generally conical chimney 182 within an inner hollow area of the central pole. FIG. 9B shows a top plan view of the central pole 180 and chimney 182, wherein the chimney 182 includes ducts D1, D2, D3, D4, and D5 extending upwards. As shown in FIG. 9A, the ducts D1, D2, D3, D4, and D5 each attach to an inner surface of the central pole 180 above a corresponding aperture 145 and extend continuously around a circumference of the inner surface of the central pole. Each duct may alternatively attach below a corresponding aperture 145 in a similar fashion. This structuring of the ducts creates the chimney 182 with a layered interior within the central pole having multiple layers that are laterally isolated from each other. Each duct directs hot air 191 flow from a cavity 147 and passage 210 up through the chimney 182 to work the turbine 150 at the top of the system 100 to convert thermal energy into electricity.

Each duct forms a ring when viewed top-down as in FIG. 9B. The innermost ring of duct D1 corresponds to the bottom panel assembly, whereas the outermost ring of duct D5 corresponds to the top panel assembly, while the rings of D2-D4 and corresponding assemblies 110 are in between. The bottom panel assembly is the widest and will therefore generate the maximum air flow and vice versa for the top panel assembly. The five ducts D1, D2, D3, D4, and D5 are provided as an example only and should not be read to limit the system 100, which may have a chimney 182 with two or more ducts 181. An alternative embodiment of the chimney 182 includes chimney segments 192 that divide the ducts into two or more separate areas.

At a given time, a portion of each panel assembly will be exposed to direct sunlight 2 and another portion will not be exposed. Relative to another part of the same panel assembly not exposed to sunlight (NE), air will rise faster from the part of the panel assembly that is exposed to direct sunlight (E). This difference in exposure is illustrated in FIG. 9C. The segments 192, as shown in FIG. 9B, will maintain the difference in air temperature and air speed within the chimney 182 to maximize hot air 191 flow through the chimney 182. The segments 192 prevent heat in the hot air 191 on an exposed side (E) of an assembly 110 from diffusing into cooler air on a non-exposed side (NE), which would lower air flow rate through the chimney 182 and turbine 150.

Referring to FIGS. 10A and 10B, embodiments of the disclosed invention include one or more airflow turbines 150. FIG. 10A illustrates an embodiment of the airflow turbine 150 having constituent blades 154 connected at a hub 155 that are disposed above the top or apex of the central pole 180. The rising hot air 191 stream increases in velocity and pressure, which is concentrated by airflow nozzle 184, causing the rotation of the blades 154 of the electricity-generating airflow turbine 150, thus creating rotational energy that is converted into electricity by the turbine 150. A chimney with a broader base and narrower top will increase the speed of the hot air 191 flow, which is concentrated at nozzle 184 to turn turbine 150 at the apex of the system 100. As hot air is directed toward the airflow turbine 150, the hot air striking the blades 154 and causing the blades to turn, which generates electricity by generator action as in the embodiments described above. FIG. 10B illustrates an alternate embodiment of the turbine 150, wherein the airflow turbine 150 may be separated from the structure of system 100 and connected via an air conduit 187 through which the hot air 191 is directed.

FIG. 11A further illustrates a cross-sectional view showing the solar panels 121 and 131 configured to be supported on racks 140, which are illustrated by broken lines. In this embodiment of the assembly, segmented racks 140 attach directly to the central pole 180 of the system 100. Solar panels 121 and 131 are laid on top of, and are supported by, the racks 140 underneath. The racks 140 provide a frame, or otherwise include openings, that does not impede the heat conduction/convection or light absorption/reflection of the panels 121 and 131, as described elsewhere in the specification. FIG. 11B is a top plan view of segments of solar panels 121, and/or panel 131, positionable on the racks 140, which are illustrated in the top plan view of FIG. 11C. With reference to FIG. 11D, solar panels 121 and 131 may comprise a transparent case or shell 183 and a photovoltaic cell contained within the case for further protection of the solar panel. Further, such cases 183 may be placed directly on the rack 140 as illustrated in the top plan views of the solar panels 121/131 and rack 140.

FIG. 12 illustrates an air pump 176 for pumping air through ducts 171 for cleaning an exterior of the system 100. Airflow 172 is pumped through ducts 171 to blow on an outer surface of shell 107. In addition, the ducts 171 are secured to the shell 107 to provide further structural strength. FIG. 12 shows the air ducts 171 and air pump 176 within the base 106 without the rest of the system 100, shown in FIG. 1, for ease of illustration. The air ducts 171 may be secured onto a surface of the shell 107 or within the shell. Further, the ducts 171 may include one or more substantially linear members along with one or more substantially circular members operably connected to transfer air between members of the air ducts 171 and to an outer surface of the shell 107, as shown in FIG. 12. The air pump 176 may be configured to provide airflow 172 intermittently, in bursts, or constantly as needed to clean the exterior of the system 100.

The solar panels may be embodied in various shapes, such as those illustrated in top plan views of different possible solar panel shapes of FIGS. 13A-13J. FIGS. 13A-13J illustrate that a panel can be a full circle or a small segment of a circle or other shapes. One of ordinary skill in the art will recognize that various types of solar panels, such as those sold by third-parties, may be used to implement the claimed invention.

Figure 14:
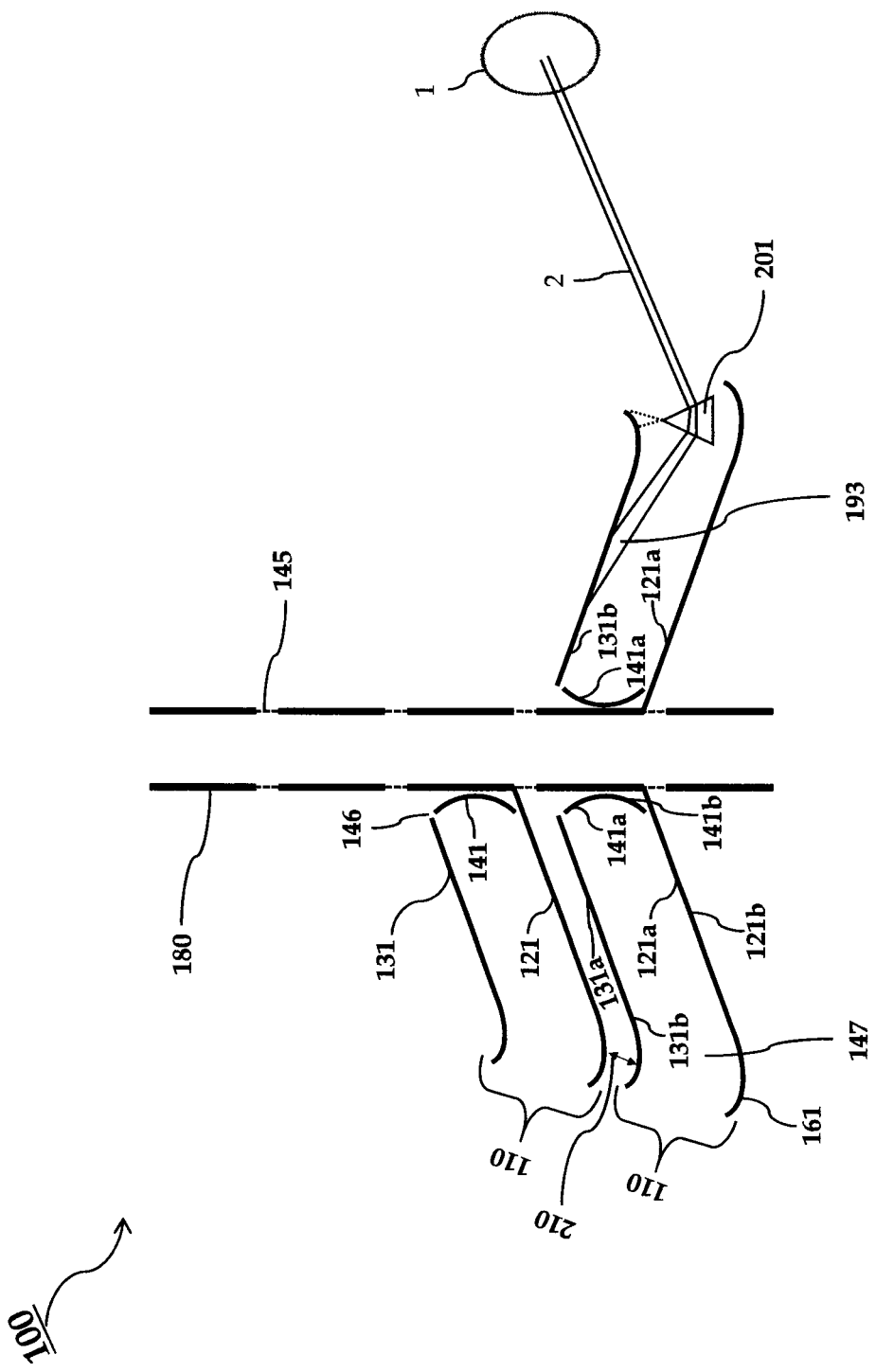
FIG. 14 is a detailed cross-section view of the solar energy collector assembly and light interaction with a light refracting prism, in accordance with an embodiment of the claimed invention.

FIG. 14 illustrates another embodiment of the system 100 in which a light refraction device 201, such as a prism, is used to disperse the spectrum of sunlight 2. As many silicon-based photovoltaic cells can absorb only a certain spectrum of light, spectrum-specific cells can be used to increase efficiency. Thus, the solar panels can be made from a variety of spectrum-specific cells. By dispersing light into various components, the spectrum-specific cells can absorb their own light spectrum easily. One or more light dispersive media may be added to one or more layers.

Figure 15:
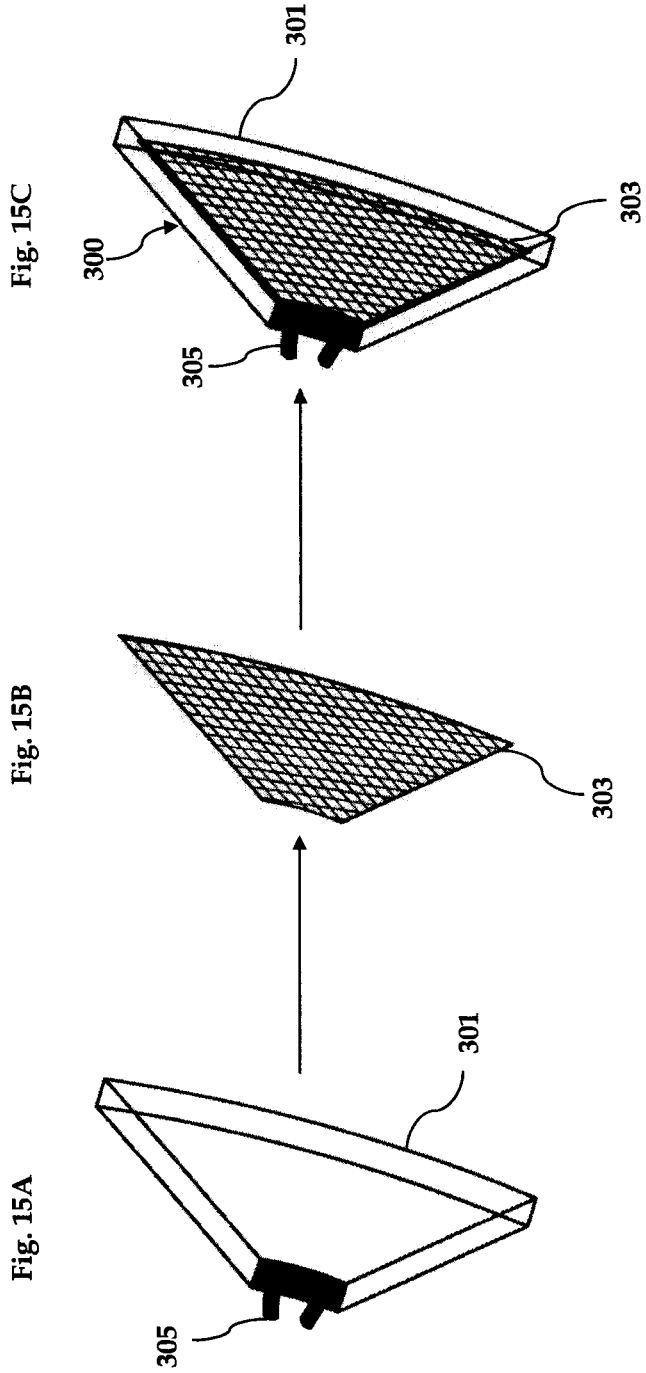
FIG. 15A is a perspective view of a clear housing segment in accordance with an embodiment of the claimed invention.
FIG. 15B is a perspective view of a photovoltaic panel in accordance with an embodiment of the claimed invention.
FIG. 15C is a perspective view of a panel segment of a solar panel assembly formed by inserting the photovoltaic panel of FIG. 15B into the clear housing segment of FIG. 15A, in accordance with an embodiment of the claimed invention.

FIGS. 15A-15C are a perspective view a panel segment 300 of a solar panel embodiment. The panel segment 300 comprises a photovoltaic panel 303 inserted into a clear housing segment 301. FIG. 15A shows the clear housing segment 301, which is transparent on nearly all sides, except a side having a one or more pins 305. Transparency of the segment 301 allows light absorption and/or reflection along both upper and lower surfaces of the photovoltaic panel 303. The side having one or more pins 305 secures the panel segment 300 along an outer surface of the central pole 180 via the one or more pins 305 inserted into one or more corresponding openings in the central pole.

The ideal material for the housing segment 301 is glass, crystal, or similar materials. These materials are clear and heat conductive. One side of the panel segment 300 needs light and the opposite side needs to transfer heat to the ambient air. The heat conductive side of the panel 303 will touch the clear housing segment 301. The clear housing segment 301 is required to provide airtight and water tight cover for the panel 303. The surface having the one or more pins 305 does not have to be transparent, as minimal light is expected to react or interact with portion of the segment 300. FIG. 15B shows the photovoltaic panel 303. The pins 305 may further electrically connect the photovoltaic panel 303 to an electrical system for transferring electricity to a battery 185. FIG. 15C shows the full panel segment 300 with photovoltaic panel 303 secured within the clear housing segment 301. The panel segment 300 should be air-tight and water-tight, similar to a light bulb. Also, the panel segment 300 can be filled with appropriate gases to enhance the life of the solar cells. Such a configuration is useful with an organic solar cell or a perovskite solar cell.

Each panel segment 300 may further include the curvature 161 along a free edge, similar to earlier embodiments. In such an embodiment, both the panel 303 and housing segment 301 would include the curvature 161.

Further, each panel 303 may be removable from its corresponding clear housing segment 301. As such, each segment 301 may include two separate portions formed to connect together to form an air-tight and water-tight seal, wherein the two separate portions form a cavity within the segment that corresponds to and houses the panel 303.

Figure 16:
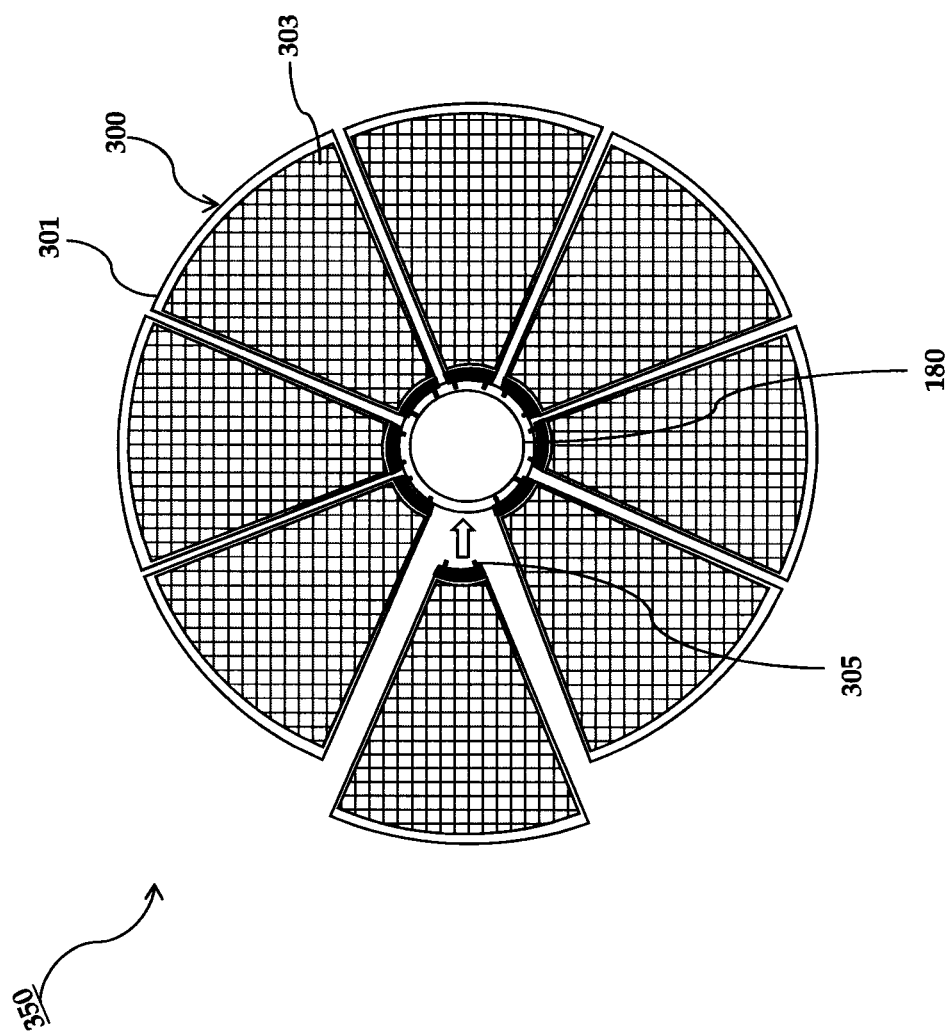
FIG. 16 is a top view of an embodiment of a solar panel made of a plurality of panel segments shown in FIG. 15.

FIG. 16 is a top view of an embodiment of a solar panel 350, which may correspond to bottom or top panels 121 and/or 131, made of a plurality of panel segments 300, as shown in FIGS. 15A-15C. The solar panel 350 embodiment of FIG. 16 comprises eight panel segments 300, but may include in total one or more panel segments 300 based on the size and shape of the panel 350, attached via pins 305 to a central pole 180 to complete a circular or elliptical shape. The solar panel 350 is attachable to the central pole 180 along with another solar panel to complete a solar panel assembly, similar to the solar panels 131 and 121 of assembly 110 shown and described in FIGS. 1-8A. In FIG. 16, a panel segment is shown being attached via pins 305 to the central pole 180 in a direction indicated by the arrow.

Figure 17A:
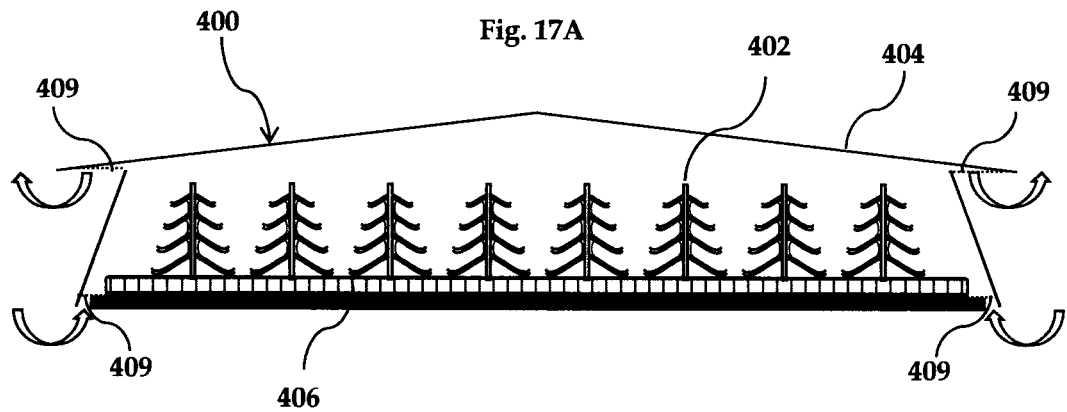
FIG. 17A is a side view of a solar panel assembly embodiment having multiple miniature solar tree assemblies and allowing air to pass into and out of the assembly.
Figure 17B:
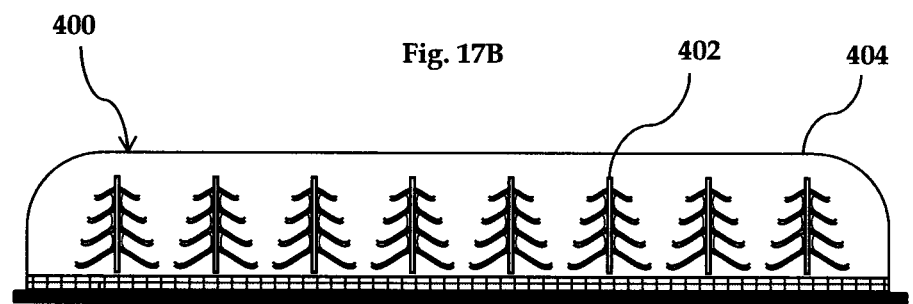
FIG. 17B is a side view of a closed solar panel assembly embodiment having multiple miniature solar tree assemblies.
Figure 17C:
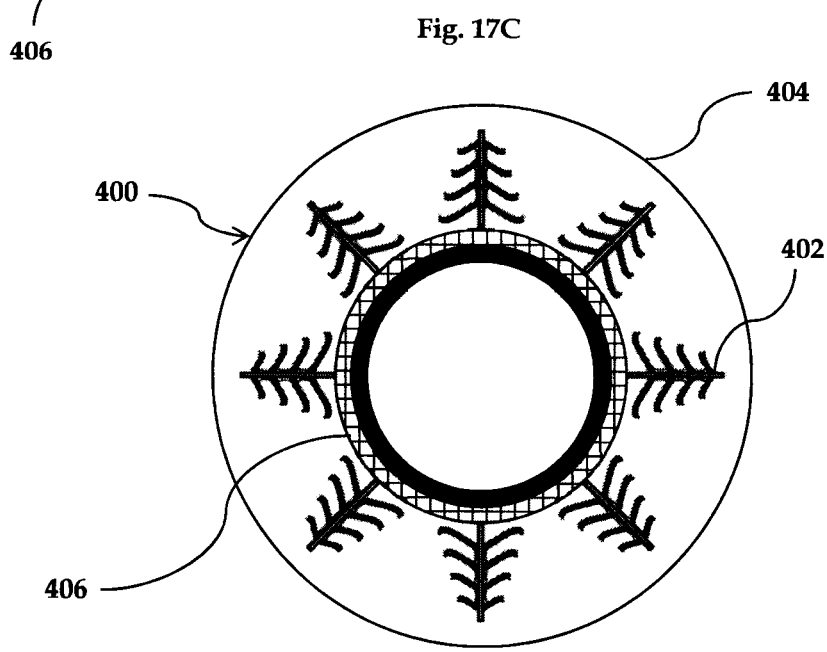
FIG. 17C is a side view of a closed solar panel assembly embodiment having multiple miniature solar tree assemblies.

FIG. 17A-17C is a side view of a solar panel assembly 400 embodiment having multiple miniature solar tree assemblies 402. A plurality of solar tree assemblies 402 are attached to a solar panel 406, which acts similarly to base 106 described in embodiments shown and described, except that the solar panel itself can absorb and reflect light to convert into electricity. Each of the solar tree assemblies 402 may be structured similarly to any of the solar tree systems 100 shown and described. A transparent cover 404 fits over the plurality of solar tree assemblies 402 and solar panel 406 to protect photovoltaic cells and other structures housed therein while still allowing light to pass through the cover. By including the plurality of solar tree assemblies 402 on a solar panel 406, a total surface area of light absorbing materials is maximized for the generation of electricity within a given area. FIG. 17A shows an embodiment of the solar panel assembly 400 wherein a plurality of openings 409 exist at overhangs of the transparent cover 404 to allow ambient air to move into and out of an interior of the assembly. Arrows show ambient air entering from openings 409 around the solar panel 406 and ambient air leaving at a top of the cover 404. FIG. 17B shows an embodiment of the assembly 400 with a fully sealed cover 404 wherein no air movement into or out of the interior of the assembly is permitted. FIG. 17C shows an embodiment of the assembly 400 with a fully sealed cover 404 wherein no air movement into or out of the interior of the assembly is permitted. This embodiment may be cylindrical or spherical. As an exposed side of the assembly gets hot, a cylindrical or spherical shape may rotate to cool down panels while continuously providing photovoltaic surfaces for absorbing sunlight. The assemblies 400 of FIGS. 17B and 17C are both appropriate for applications in space.

Figure 18:
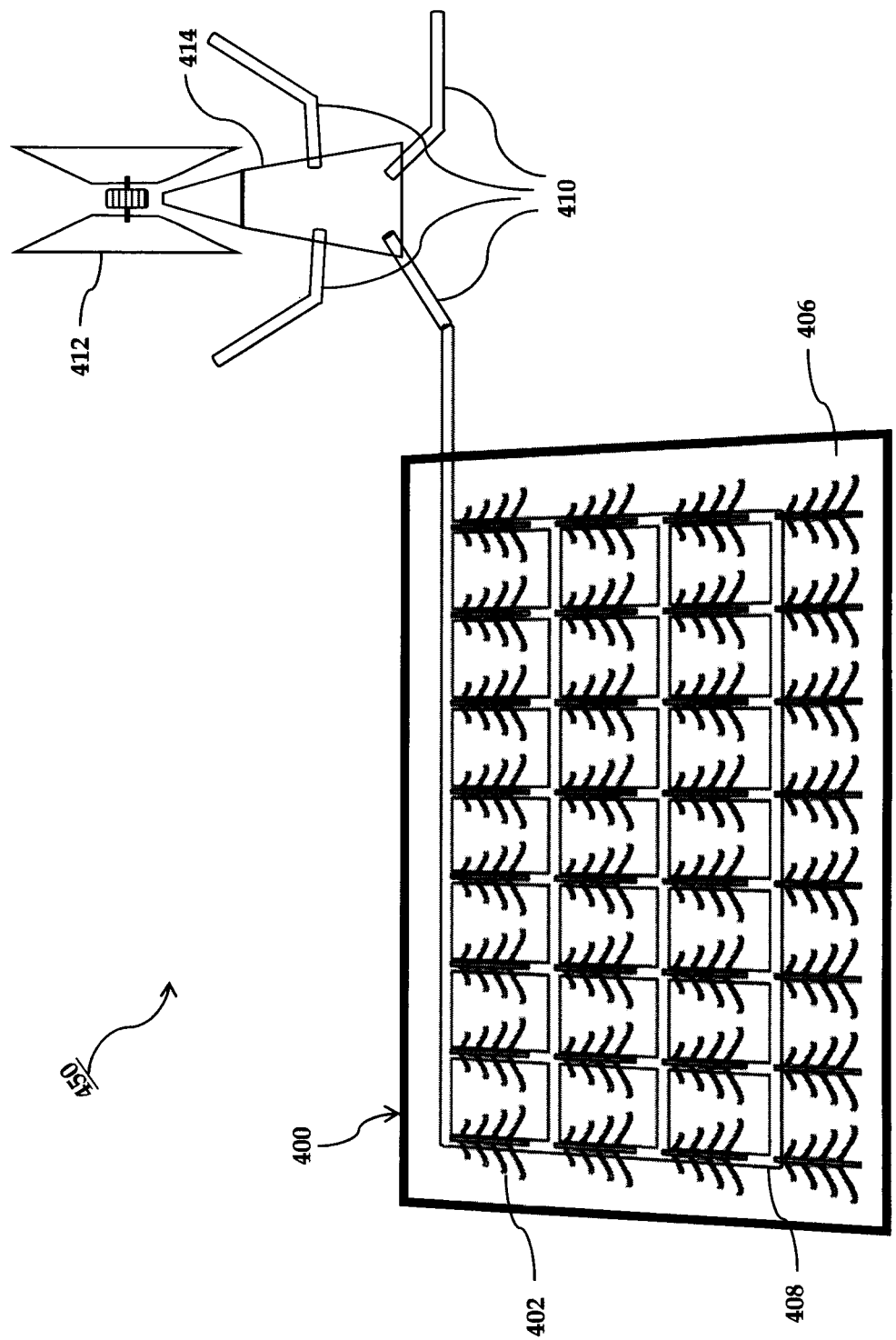
FIG. 18 is a perspective view of the solar panel assembly embodiment of FIG. 17A further illustrating a generator unit of the embodiment.

FIG. 18 is a perspective view of the solar panel assembly 400 embodiment of FIG. 17A, by example, as part of a larger electrical power generator system 450. The assembly 400 embodiments of FIGS. 17B and 17C could likewise be utilized in a similar fashion. In FIG. 18, the transparent cover 404 is removed for ease of viewing, but would otherwise cover the assembly 400 as shown in FIG. 17A. The solar panel assembly includes the plurality of solar tree assemblies 402 are attached to a solar panel 406. However, in the embodiment of the system 450 shown in FIG. 18, a system of air ducts 408 optionally connects each solar tree assembly to allow airflow of hot air to be collected and transported via a connecting duct 410 to a generator chimney 414 of a turbine system 412. The collected hot air travels up the chimney to act on a plurality of blades to turn a hub generating rotational energy which can then be converted into electricity. A plurality of connecting ducts 410 are shown to indicate that a plurality of solar panel assemblies 400 as shown in FIG. 18 may be included in the system 450, wherein each connecting duct corresponds to a separate assembly 400.

Embodiments of the present invention are variously configured to derive electricity from the solar panel assemblies 110 and additional sources, such as electricity generated by the internal airflow turbine 150. The output may be supplied over conductors (not shown) to the battery 185. Electricity from these sources may be combined for convenience if permitted by the parameters of the generated electricity. In one embodiment, the solar panels and the airflow turbine generate DC electricity allowing use of a single power conductor to emerge from the solar energy tree. The DC electricity is converted to AC electricity in an inverter 186 for direct use by a consumer or for input to an electrical grid. The inverter 186 and associated controls can be located at the base 106 or in a separate proximate structure.

The airflow turbine 150 comprises a plurality of blades 154 extending from a rotating drive shaft 155 that turns an electricity-generating generator. The generator may produce alternating or direct current, and operates according to commutation and induction principles as is known to those skilled in the art. The present invention is intended to encompass all types of apparatuses for generating electricity from light and thermal airflow sources. Those skilled in the art of generators and airflow turbines will recognize that any of several different generator types (and coil windings) may be used in conjunction with the airflow turbine to generate electricity. Any of these generator and winding types are within the scope of the present invention.

Many of the described embodiments include both solar panels and airflow turbines within the same overall structure. However, this is not required as the inventive features can be applied separately to create a solar energy tree for generating electricity from light and a separate structure for an airflow turbine generating electricity from the movement and ventilation of hot air from a solar energy tree assembly.

While the invention has been described with reference to preferred embodiments, it will be understood by those skilled in the art that various changes may be made and equivalent elements may be substituted for elements thereof without departing from the scope of the present invention. The scope of the present invention further includes any combination of the elements from the various embodiments set forth. In addition, modifications may be made to adapt a particular situation to the teachings of the present invention without departing from its essential scope. Therefore, it is intended that the invention not be limited to the particular embodiment disclosed as the best mode contemplated for carrying out this invention, but that the invention will include all embodiments falling within the scope of the appended claims.

I claim:

1. A solar energy collection system, comprising:
   a central pole including an interior cavity and one or more apertures along a height of the central pole, the one or more apertures allowing airflow into the interior cavity of the central pole;
   one or more solar panel assemblies, each solar panel assembly comprising:
      a first solar panel having one or more photovoltaic cells and extending radially from the central pole,
      a second solar panel having one or more photovoltaic cells and extending radially from the central pole and disposed beneath the first solar panel, and
      a third solar panel having one or more photovoltaic cells and disposed vertically between the first solar panel and the second solar panel, the third solar panel being proximate to the central pole, wherein respective free ends of the first solar panel and the second solar panel are separated to form a cavity between the first solar panel, second solar panel, and third solar panel, wherein light enters the cavity to be absorbed by the one or more photovoltaic cells of the first solar panel, second solar panel, and third solar panel to generate electricity;
   an electricity-generating turbine disposed at a top of the central pole and having a rotating hub and a plurality of blades configured to receive the airflow entering the interior cavity of the central pole via the one or more apertures, wherein the airflow moves upwardly and drives the plurality of blades to rotate the rotating hub to generate electricity; and
   electrical conductors for supplying electricity derived from the one or more photovoltaic cells in each solar panel assembly and from the electricity-generating turbine.

2. The system of claim 1, wherein the first solar panel includes a heat conducting top surface and the one or more photovoltaic cells are disposed along a bottom surface to absorb and reflect light,
   wherein the one or more photovoltaic cells of the second solar panel are disposed along a top surface to absorb and reflect light, the second solar panel also having a heat conducting bottom surface, and
   wherein the one or more photovoltaic cells of the third solar panel are disposed along an outer surface to absorb and reflect light, the third solar panel also having a heat conducting inner surface.

3. The system of claim 2, comprising two or more solar panel assemblies stacked concentrically at different heights on the central pole, wherein each solar panel assembly is separated by an aperture of the one or more apertures in the central pole.

4. The system of claim 3, wherein the second solar panel of each of the one or more solar panel assemblies extends radially beyond the first solar panel of the solar panel assembly.

5. The system of claim 1, wherein each of the one or more apertures corresponds to an air duct within the interior cavity of the central pole and the airflow moves through each air duct.

6. The system of claim 3, wherein heat conducting surfaces of the solar panels channel the airflow comprising hot air into the interior cavity through the one or more apertures.

7. The system of claim 6, wherein the airflow in the interior cavity is concentrated by a nozzle attached at the apex of the central pole.

8. The system of claim 7, wherein the airflow through the nozzle imparts a force onto the plurality of blades actuating rotation of the turbine.

9. The system of claim 1, wherein the solar panel assembly includes a perforation at an at least one end of the third solar panel allowing hot air to exit the cavity.

10. The system of claim 1, wherein the respective free ends of the first solar panel and the second panel each include an upward curvature configured to reflect light into the cavity of each solar panel assembly.

11. The system of claim 1, further comprising one or more light dispersion mediums disposed in the cavity proximate the respective free ends of the first solar panel and the second solar panel.

12. The system of claim 3, wherein adjacent solar panel assemblies are arranged such that the perimeter of the bottom solar panel of one solar panel assembly does not extend beyond the perimeter of the top solar panel of an adjacently lower solar panel assembly.

13. The system of claim 1, further comprising a base for mounting the central pole, wherein the base includes at least one battery for storing electrical energy generated by the system, a power inverter, and an air pump.

14. The system of claim 1, further comprising a clear shell to cover the one or more solar panel assemblies and the electricity-generating turbine.

15. The system of claim 14, wherein the clear shell allows the entrance of ambient air through an air filter, the clear shell has openings where the ambient air can exit the system, and wherein the clear shell includes ducts to spray air streams on an outer surface of the clear shell to clear debris.

16. The system of claim 1, where the solar panel assembly further comprises one or more racks attached to the central pole and supporting the first solar panel, the second solar panel and the third solar panel, and wherein the one or more racks include openings that does not impede the passage of air and light.

17. The system of claim 1, wherein the first solar panel and the second solar panel of each solar panel assembly include a clear shell housing each of the one or more photovoltaic cells.

18. A method for creating electricity from a solar panel and hot air turbine, comprising the steps of:
- stacking a plurality of solar panels concentrically around a central pole, wherein the solar panels are spaced apart vertically and arranged to form a conical structure;
- connecting apertures in the central pole with a nozzle through a plurality of air ducts formed in an interior of the central pole to impart air onto an airflow turbine; and
- supplying energy collected from the solar panels and airflow turbine.

19. An apparatus for generating electricity, comprising:
- a solar panel;
- a clear housing attached to a surface of the solar panel; and
- a plurality of solar energy collection systems attached to the surface of the solar panel and housed within the clear housing, each solar energy collection system comprising:
  - a central pole including an interior cavity and one or more apertures along a height of the central pole, the one or more apertures allowing airflow into the interior cavity of the central pole;
  - one or more solar panel assemblies, each solar panel assembly comprising:
    - a first solar panel having one or more photovoltaic cells and extending radially from the central pole,
    - a second solar panel having one or more photovoltaic cells and extending radially from the central pole and disposed beneath the first solar panel, and
    - a third solar panel having one or more photovoltaic cells and disposed vertically between the first solar panel and the second solar panel, the third solar panel being proximate to the central pole, wherein respective free ends of the first solar panel and the second solar panel are separated to form a cavity between the first solar panel, second solar panel, and third solar panel, wherein light enters the cavity to be absorbed by the one or more photovoltaic cells of the first solar panel, second solar panel, and third solar panel to generate electricity;
  - an electricity-generating turbine disposed at a top of the central pole and having a rotating hub and a plurality of blades configured to receive the airflow entering the interior cavity of the central pole via the apertures, wherein the airflow moves upwardly and drives the plurality of blades to rotate the rotating hub to generate electricity; and
- electrical conductors for supplying electricity derived from the one or more photovoltaic cells in each solar panel assembly and from the electricity-generating turbine.

20. A solar farm system, comprising:
A plurality of apparatuses according to claim 19, each apparatus connected to a central electricity-generating turbine by a series of ducts attached to each solar energy collection system of each apparatus, each series of ducts further connected to the central electricity-generating turbine by a connecting air duct, wherein airflow travels from each solar energy collection system into the series of ducts into the connecting air duct and through the central electricity-generating turbine to generate electricity.

* * * * *